(12) United States Patent
Zhen

(10) Patent No.: US 6,298,468 B1
(45) Date of Patent: Oct. 2, 2001

(54) PLACEMENT-BASED PIN OPTIMIZATION METHOD AND APPARATUS FOR COMPUTER-AIDED CIRCUIT DESIGN

(75) Inventor: Cai Zhen, Singapore (SG)

(73) Assignee: Prosper Design Systems Pte. Ltd., Singapore (SG)

( * ) Notice: Subject to any disclaimer, the term of this patent is extended or adjusted under 35 U.S.C. 154(b) by 0 days.

(21) Appl. No.: 09/305,802

(22) Filed: May 4, 1999

(51) Int. Cl.$^7$ .................................................. G06F 17/50
(52) U.S. Cl. ...................................... 716/2; 716/7
(58) Field of Search ................... 716/2, 7, 8, 10, 716/12

(56) References Cited

U.S. PATENT DOCUMENTS

| | | | |
|---|---|---|---|
| 5,309,370 | 5/1994 | Wong | 716/13 |
| 5,363,313 | * 11/1994 | Lee | 716/2 |
| 5,544,088 | 8/1996 | Aubertine et al. | 716/13 |
| 5,757,658 | 5/1998 | Rodman et al. | 716/10 |
| 5,914,887 | 6/1999 | Scepanovic et al. | 716/8 |
| 6,233,329 | * 4/2001 | Ling et al. | 716/7 |

OTHER PUBLICATIONS

C. Niessen, "Hierarchical Design Methodologies and Tools for VLSI Chips," IEEE vol. 71, No. 1, Jan. 1983, pp. 66–75.

Jiri Soukup, "Circuit Layout," IEEE, vol. 69, No. 10, Oct. 1981, pp. 1281–1304.

Masahiro Fukui, et al., "A Block Interconnection Algorithm for Hierarchical Layout System," IEEE, vol. CAD–6, No. 3, May 1987, pp. 383–391.

Koide et al., "A Timing–Driven Global Routing Algorithm with Pin Assignment, Block Reshaping, and Positioning for Building Block Layout," Proceeding of 1998 Asia and South Pacific Design Automation Conference, Yokohama, Japan, Feb. 10–13, 1998. IEEE, 1998, pp. 577–583.

* cited by examiner

Primary Examiner—Trong Phan
(74) Attorney, Agent, or Firm—James D. Ivey

(57) ABSTRACT

Soft pin locations in a hybrid paradigm are optimized according to circuit density centers of circuit components coupled to the soft pins. As a result, the soft pins are located closer to components with heavier loads and further from components with lighter loads. Circuit density centers are determined by summing coordinates weighted by circuit loads, including capacitance and resistance, and dividing the summed weighted coordinates by a sum of the weights. To avoid blockage, optimized soft pin locations can be moved to soft block boundaries relative to the optimized locations.

16 Claims, 20 Drawing Sheets

PLACEMENT-BASED PIN OPTIMIZATION METHOD AND APPARATUS FOR COMPUTER-AIDED CIRCUIT DESIGN

FIELD OF THE INVENTION

The present invention relates to computer-aided circuit design including automatic placement and routing of integrated circuits and field-programmable gate arrays and, in particular, to a particularly efficient mechanism by which particularly complex and high-performance circuits can be better and more efficiently designed to a layout level.

BACKGROUND OF THE INVENTION

Many electrical circuits designed today are extremely complex and include, for example, many millions of individual circuit elements such as transistors and digital logic gates. Circuit complexity has greatly surpassed the capacity of all conventional design techniques using computer aided design systems. In particular, circuit complexity is challenging the available resources of even the largest, most sophisticated computer aided automatic layout place and route design systems.

There are primarily three paradigms by which automatic layout place and route design systems are used by engineers to design electrical circuits layout. The first is called the flat paradigm. In the flat paradigm, the circuit under design is represented entirely at a physical layout abstraction level such that individual logic gates and pre-laid-out function blocks are shown directly and are placed and routed directly by automatic layout techniques. The advantage of the flat paradigm is that to optimize the global placement of layout gates and global wiring of connections between gates is relatively easy. The disadvantage of the flat paradigm is that the requisite computer resources and computing time increase exponentially with an increase of complexity of the circuit under design and can quickly overwhelm the computer capacity of any computer aided design system and the project design schedule.

This disadvantage of the flat paradigm is overcome by the second paradigm, i.e., the hierarchical paradigm. In the hierarchical paradigm, circuit elements are combined into functional blocks such that the functional blocks serve as abstractions of underlying circuit elements. Such functional blocks can be combined into larger, more abstract, functional blocks of a higher level of a hierarchy. For example, a computer processor can be designed as including a relatively small number of functional blocks including a memory management block, an input/output block, and an arithmetic logic unit. The arithmetic logic unit can be designed to include a relatively small number of functional blocks including a register bank, an integer processing unit, and a floating point processing unit. The integer processing unit can include sub-blocks such as an adder block, a multiplier block, and a shifter block. At the lower levels of the hierarchical design specification, blocks are as simple as flip-flops and digital logic gates, and blocks are individual elements such as transistors, resistors, capacitors, inductors, and diodes at the lowest level of the hierarchy.

The primary advantage of the hierarchical paradigm is that engineers can design complex circuits by designing relatively small functional blocks and using such designed blocks to build bigger blocks. In other words, the seemingly insurmountable job of designing a highly complex circuit is divided into small, workable design projects. Each of the function blocks can be easily placed and routed by the flat paradigm. The use of computer resources and computing time can be controlled simply by this paradigm. In addition, functional blocks designed for one circuit can be used as components of a different circuit, thereby reducing redundant effort by the engineers.

The primary disadvantage of the hierarchical paradigm is that significantly accurate global net wiring is particularly difficult to realize since each functional block of a hierarchical design is independently instantiated to render a flat layout of the specific electrical elements which implement the hierarchical design. The timing delay skew of a clock net, for example, between such independently instantiated functional blocks must be minimized in a layout design, i.e., various flip-flop logic gates must receive a global clock signal in the same time. However, in the actual design, electrical signals propagate from source to various destinations at different times due to variations in specific routes and surrounding conditions. Several conventional techniques for resolving timing delay skews, e.g., the "Clock-Tree-Synthesis," require circuit designs specifying according to the flat paradigm to minimize the timing delay skew. Circuit design according to the hierarchical paradigm is generally inadequate to resolve global net routing requirements since the functional blocks have been abstracted and fixed.

The third paradigm is called the "Hybrid Paradigm" and provides the advantages of both the flat and hierarchical paradigms by which a hierarchical design can be more efficiently and accurately rendered to a layout-level circuit. This hybrid paradigm is described more completely in U.S. patent application Ser. No. 09/098,599 by Cai Zhen and Zhang Qiao Ling entitled "Hybrid Design Method and Apparatus for Computer-Aided Circuit Design" filed Jun. 17, 1998. Circuit layout design using CAD systems according to the hybrid paradigm have shown significantly better performance than systems according to either of the other two paradigms.

In both hierarchical and hybrid paradigms, circuit designs are partitioned into sub-blocks and glue logic circuits including primary logic components can not be simply partitioned into sub-blocks. The partitioned circuit is normally referred to as "top-level". Circuits that are completely included within sub-blocks are referred to as "block-level". A sub-block includes connection terminals called "pins" and internal circuit logic of the sub-block. The pins of a sub-block act as relay points that connect the sub-blocks and glue logic in the top-level and connect the internal circuitry of sub-blocks with the top-level circuits.

The location of these pins of sub-blocks are important in the hierarchical paradigm and hybrid paradigm. Good pin locations can result in an integrated-circuit layout of a smaller physical area and faster electrical signal propagation. Conversely, poor pin locations result in a bigger circuit layout area and slower signal propagation through the circuit. Hence, the pins need to be optimized in the hierarchical and hybrid paradigms.

Currently, pin optimization methods are limited to one level optimization, i.e., top-level pin optimization. There are various techniques for top-level pin optimization process. The major assumptions of these methods are: (1) all sub-blocks are ideal and (2) timing delays are uniform. The first assumption is based upon an assumption that routability inside sub-blocks is independent of pin locations. As used herein, the term routability refers to the degree to which components can be wired without design-rule violation in a given area. The second assumption is based upon an assumption that the timing delay from each pin to its connected components is the same regardless of the distance and capacitive load effects of the connected components. Thus, any pin optimization methods based on these two assumptions will result in two disadvantages: (i) sub-blocks may not be routable and (ii) timing delay from sub-block pins to components on the same net is non-predictable, perhaps resulting in very large timing delay skews of the net.

What is needed is a system for optimizing pins of sub-blocks globally with respect to both geometry locations and electrical signal timing considerations, and with respect to both top-level optimization and block-level optimization.

SUMMARY OF THE INVENTION

In accordance with the present invention, soft pin locations in the hybrid paradigm are optimized according to circuit density centers of circuit components coupled to the soft pins. As a result, the soft pins are located closer to components with heavier loads and further from components with lighter loads. The result is that timing delay skews are minimized. It has also been determined that circuits can be realized in less area as well with soft pin locations optimized in this manner.

Circuit density centers are determined by summing coordinates weighted by circuit loads, including capacitance and resistance, and dividing the summed weighted coordinates by a sum of the weights.

To avoid blockage, optimized soft pin locations can be moved to soft block boundaries relative to the optimized locations. In particular, a driving-driven pin pair defines a rectangular area which intersects a single boundary of a soft block. The soft pin of the soft block is moved to the boundary of the soft block at one of a number of points defined by the rectangular area. In particular, the rectangular area defines two points at the edges of the area and a third in the middle. The soft pin is moved to any of these points defined by the rectangular area which is determine to lie along a routable wire path.

By moving the soft pin to a new location along the soft block boundary avoids obstruction by the soft block itself. In addition, aligning the soft pin according to the optimized location of the soft pin preserves the benefits of optimization according to circuit density centers.

BRIEF DESCRIPTION OF THE DRAWINGS

FIG. 4 is a block diagram of a circuit which display the electrical density center representation of pins the nets in the high-level circuit connect to.

DETAILED DESCRIPTION

In accordance with the present invention, placement of soft pins of a hierarchical circuit design is optimized according to density centers of connected circuitry. In particular, soft pins, once placed at soft block boundaries according to the hierarchical paradigm are moved to density centers within a driving soft block and a driven soft block to optimize routing to and from the soft pins. Routing between the soft pins is later accomplished in accordance with techniques employed in accordance with the hierarchical paradigm. Blockage in such later routing can be avoided by moving soft pins back to soft block boundaries relative to the soft pin locations as previously optimized.

Figure 1:
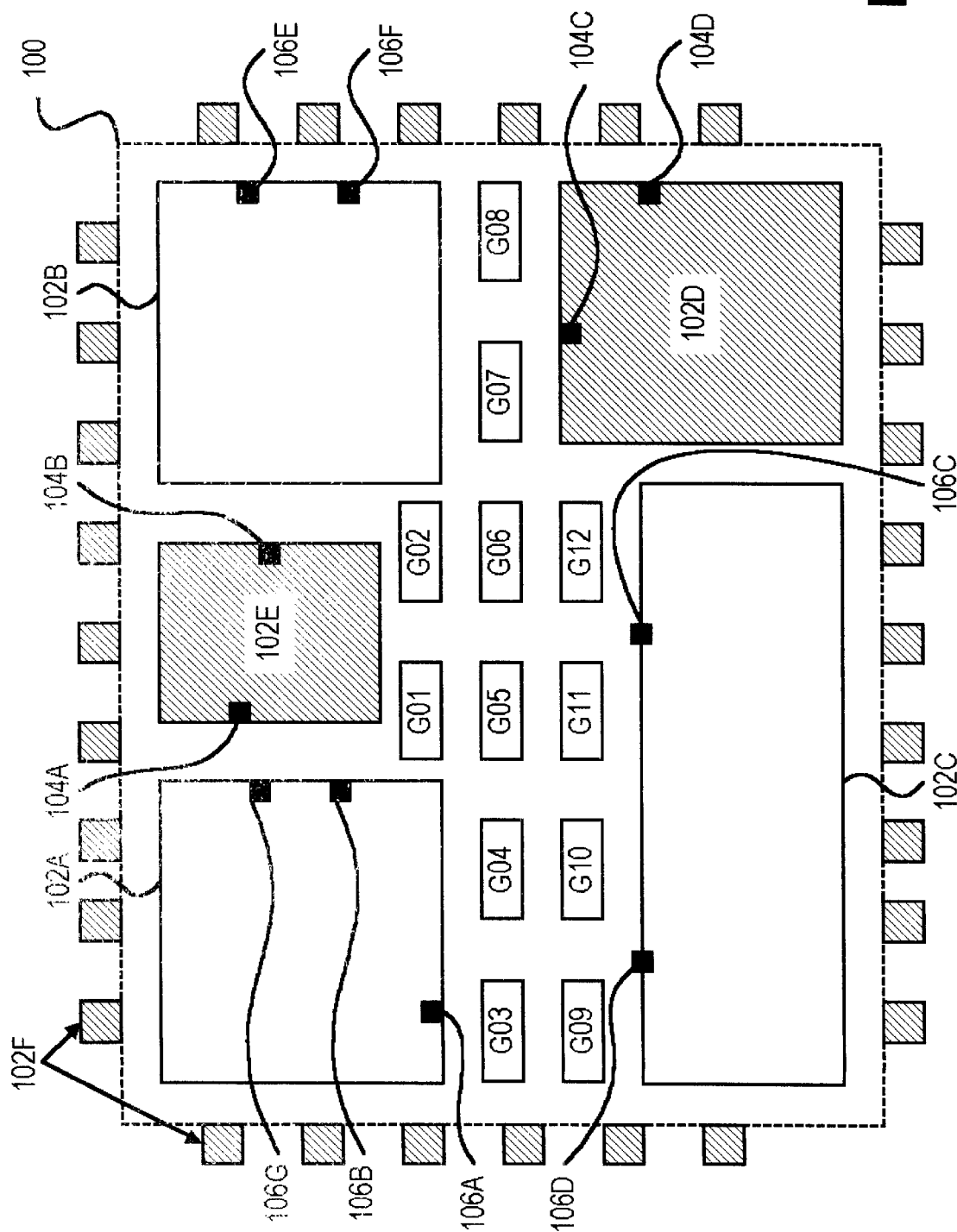
FIG. 1 is a block diagram of a circuit which include a number of blocks and core cells in the high-level representation.

Circuit design according to a hierarchical paradigm is described in U.S. patent application Ser. No. 09/098,599 by Cai Zhen and Zhang Qiao Ling entitled "Hybrid Design Method and Apparatus for Computer-Aided Circuit Design" filed Jun. 17, 1998, and that description is incorporated herein by reference. Briefly, in accordance with the hierarchical paradigm, a circuit specification is partitioned into sub-circuits called "soft blocks," macro function module sub-circuit called "hard blocks," and glue logic circuitry. Glue logic circuitry is a collection of electrical logic components which are called "core cells" and which make logic connections among all electrical components of the entire circuit. FIG. 1 shows a floor plan of a circuit design 100 which is particularly simple to facilitate understanding and appreciation of the present invention.

Circuit design 100 includes only three soft blocks 102A–C and two hard blocks 102D–E and one glue logic collection which includes core cell components G01–G12. The surrounding blocks 102F are pads of circuit design 100. A pad is generally a conducting element of a circuit design, which is used to connect electrical wires between the circuit and its package frame. In this illustrative example, soft blocks 102A–C each specify a portion of a circuit design in a logical connectivity format such as Design Exchange Format (DEF) netlists without specific details regarding the layout specification of individual elements and completed routing information of connection among electrical components. In addition, hard block 102D–E each specify a portion of circuit design 100 in which the physical layout of individual elements, including such placement and routing, has been completed and fixed. Accordingly, soft blocks 102A–C can be modified relatively easily by human circuit design engineers to effect changes in circuit design 100 while hard blocks 102D–E generally can not be modified. Pins 104A–D are pins of hard blocks 102C–D. As used herein, a pin is a connection point with geometrical area and location which connects an electrical signal between soft blocks, hard blocks, or other electrical components. The pins of hard blocks and electrical components are fixed and can not be easily modified. As is shown in FIG. 1, pins 104A–D are fixed relatively to their respective hard blocks.

Pins 106A–G are pins of soft blocks 102A–C in FIG. 1. Pins of soft block are called "soft pins." Soft pins can be modified and re-located before the layout of the associated soft block of the pin is completed. Herein, optimization of soft pins refers to location of soft pins such that circuit design 100 can be routed in a smaller area and to provide better signal timing among the connections. Circuit design 100 and its contents are merely illustrative examples; the pin location optimization described herein is equally applicable to many variations in circuit designs.

Figure 2:
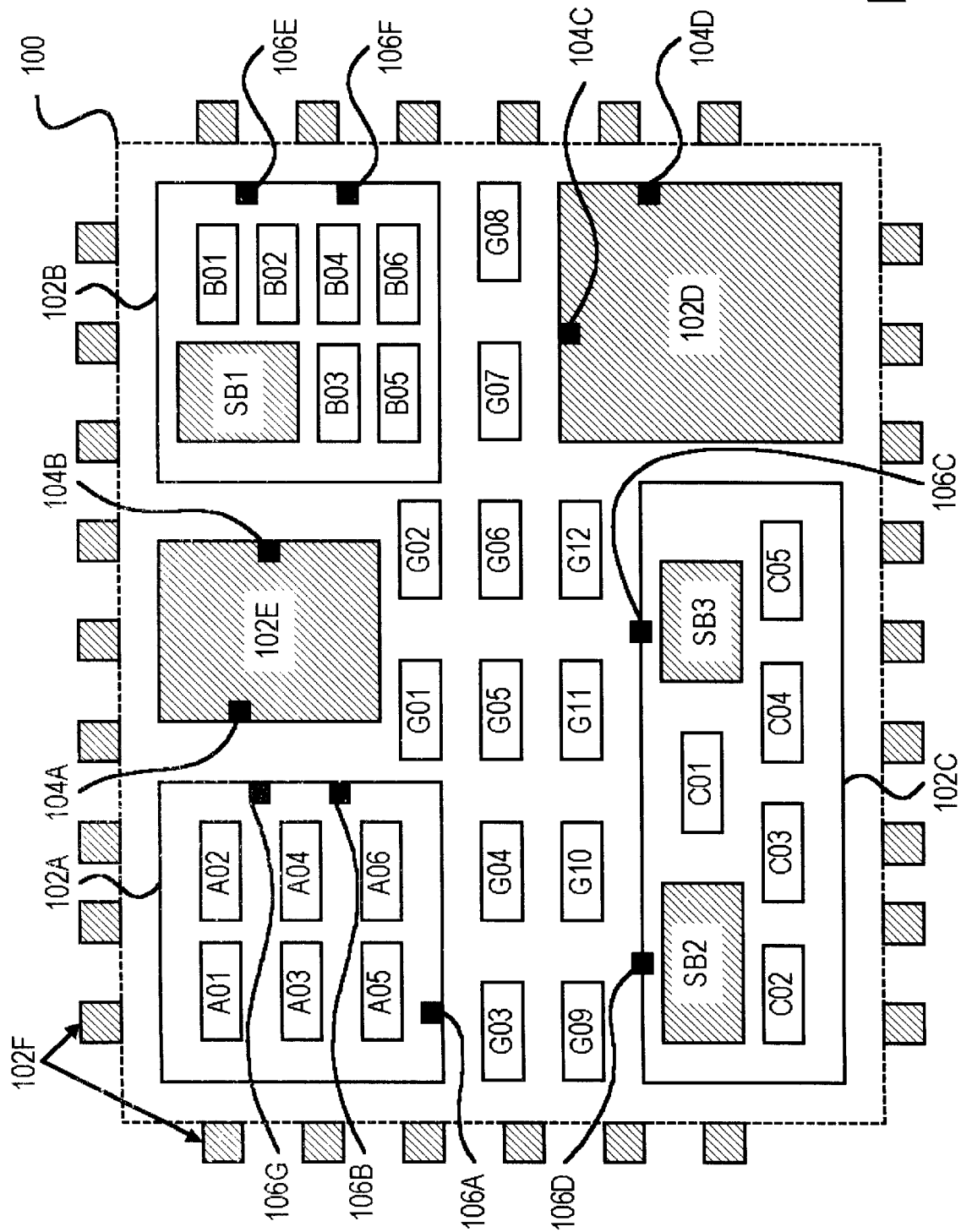
FIG. 2 is a block diagram of a circuit with detail information in the block-level representation.
Figure 9:
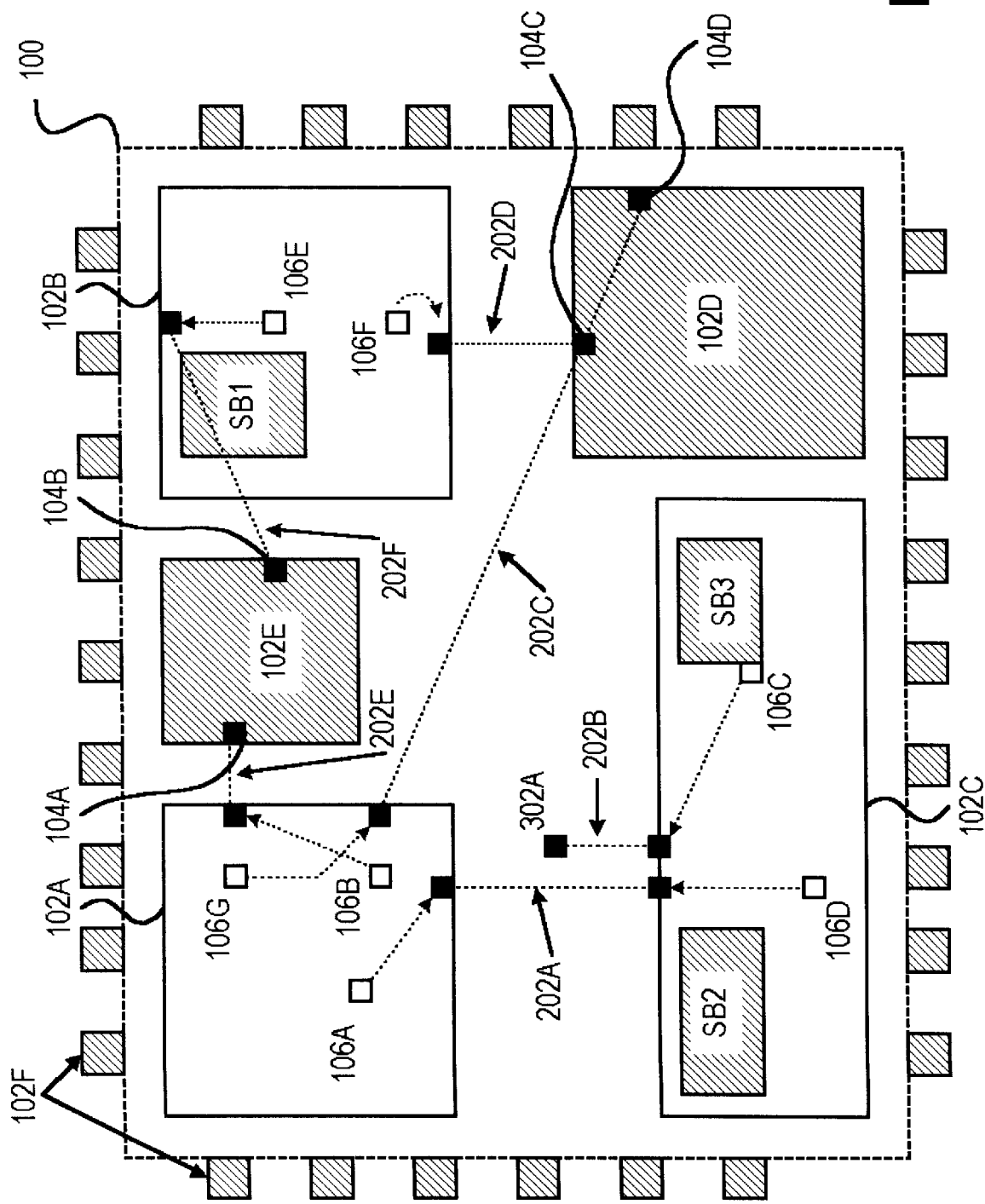
FIG. 9 is a block diagram of a circuit which displays the result of crossover reduction of flight lines of nets.

As described below, CAD application 2042 (FIG. 20) executes within processor 2002 from memory 2004. CAD application 2042 determines better locations of pins 106A–G on soft blocks 102A–C FIGS. 4 and 9) of circuit design 100 in a manner described more completely below such that routing complexity and electrical signal timing delay can both be reduced when realizing circuit design 100 at a layout level. Furthermore, relocation of soft pins by CAD application 2042 (FIG. 20) can significantly reduce skews of electrical signal timing delays to core cells A01–06 (FIG. 2), B01–06 and C01–05 inside soft block circuits 102A–C.

Figure 10A:
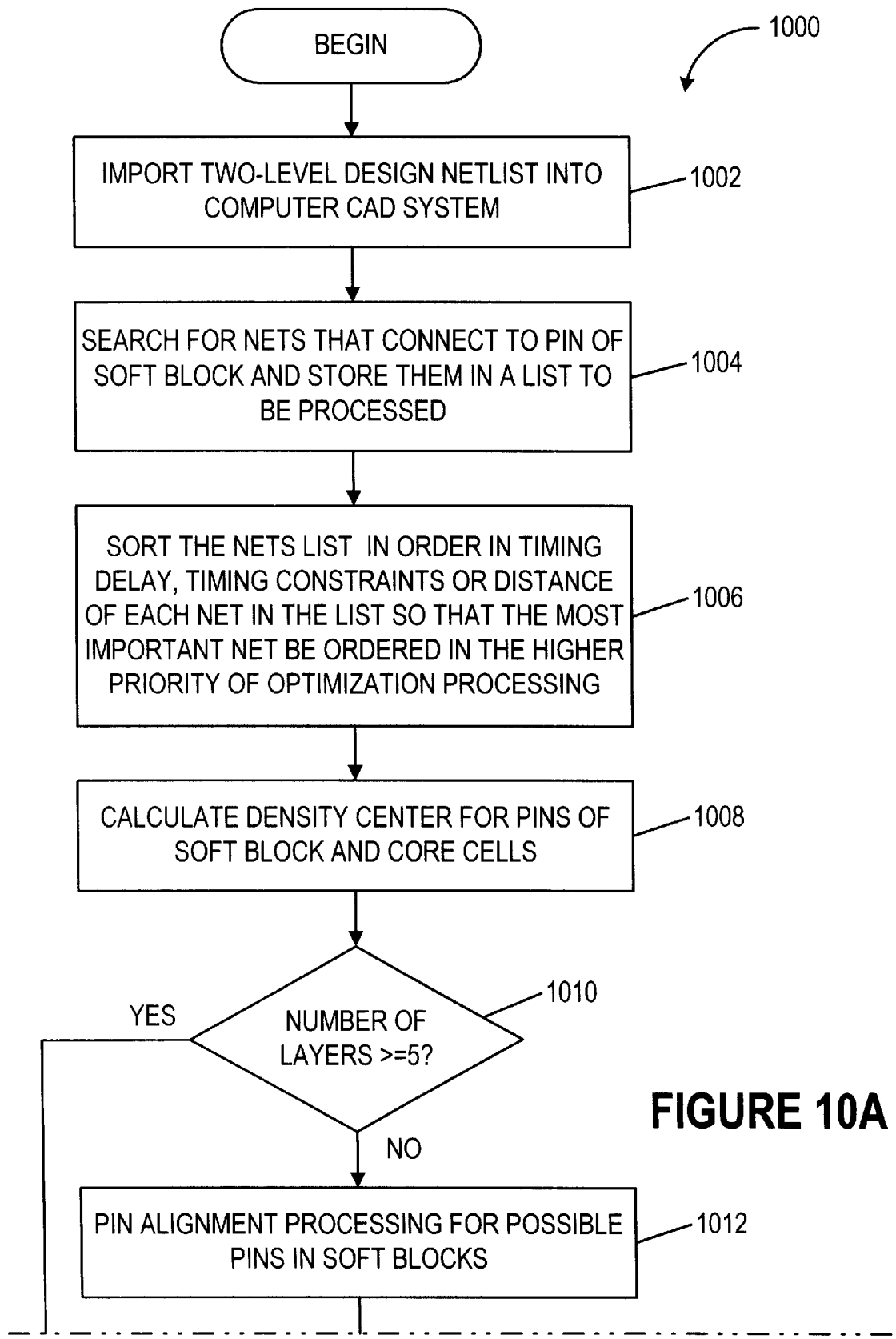
FIG. 10 is a process flow diagram of pin optimization in accordance with the present invention.
Figure 10B:
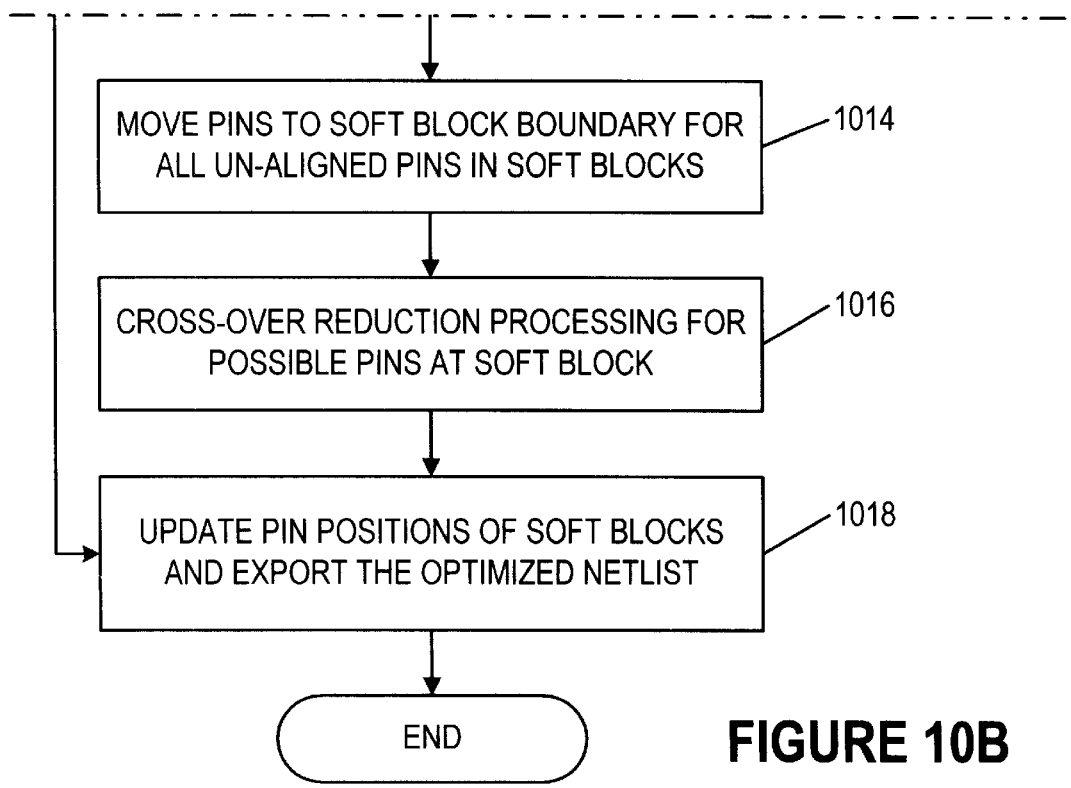
Figure 10:
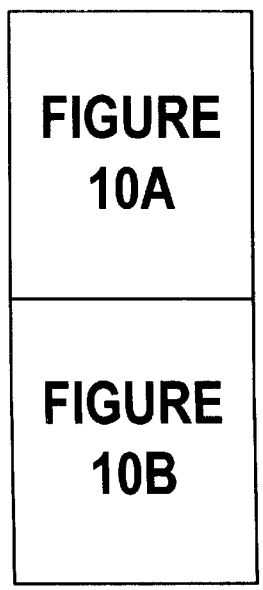

Processing of circuit design 100 by CAD application 2042 (FIG. 20) according to the present invention is illustrated by logic flow diagram 1000 (FIG. 10). In step 1002 with which logic flow diagram 1000 begins, a human circuit design engineer or any conventional CAD system logically divides circuit design 100 (FIG. 1) into various blocks, e.g., soft blocks 102A–C, hard block 102D–E, glue logical components G01–12, and pads 102F. Pins 104A–D are pins of hard blocks and pins 106A–G are soft pins of soft blocks 102A–C.

To facilitate appreciation of the present invention, the various components of circuit design 100 are briefly described. The blocks into which circuit design 100 is divided can include hard blocks, soft blocks, and glue logic such as groups of gates. In addition, the blocks have proper timing and other constraints that are met in forming the blocks of circuit design 100 using conventional techniques and tools. A floor plan for the blocks of circuit design 100 is formed through conventional automatic floor planner or human circuits design engineer to thereby estimate relative positions of blocks 102A–E. The placement of glue logic G01–G12 (FIG. 1) is completed through any conventional techniques and tools. Soft pins 106A–G (FIG. 1) are initially located in the floor planning stage. The logic netlist and components of each of soft blocks 102A–C (FIG. 1) are placed, i.e., have their respective locations in the floor plan of circuit design 100 determined. Components A01–06 (FIG. 2) are components of soft block 102A, components B01–06 are components of soft block 102B, and components C01–05 (FIG. 2) are components of soft block 102C. Block SB1 is a sub-hard block of soft block 102B. Blocks SB2 and SB3 are sub-hard blocks of soft block 102C. The relative positions of components A01–06 within soft block 102A are fixed as are the relative positions of components B01–06 and SB1 within soft block 102B and the relative positions of components C01–05, SB2 and SB3 within soft block 102C. In this illustrative example, CAD application 2042 (FIG. 20) imports (i) a high-level circuit netlist 2040A which represents circuit design 100 (FIG. 1) and (ii) soft block level circuit netlist 2040B (FIG. 20) which represents soft blocks 102A–102C (FIG. 2) in step 1002 (FIG. 10). CAD application 2042 FIG. 20) also imports a hard block and cell layout specification 2040C which defines geometry layout and timing information of hard blocks and cells into computer memory 2004.

Figure 3:
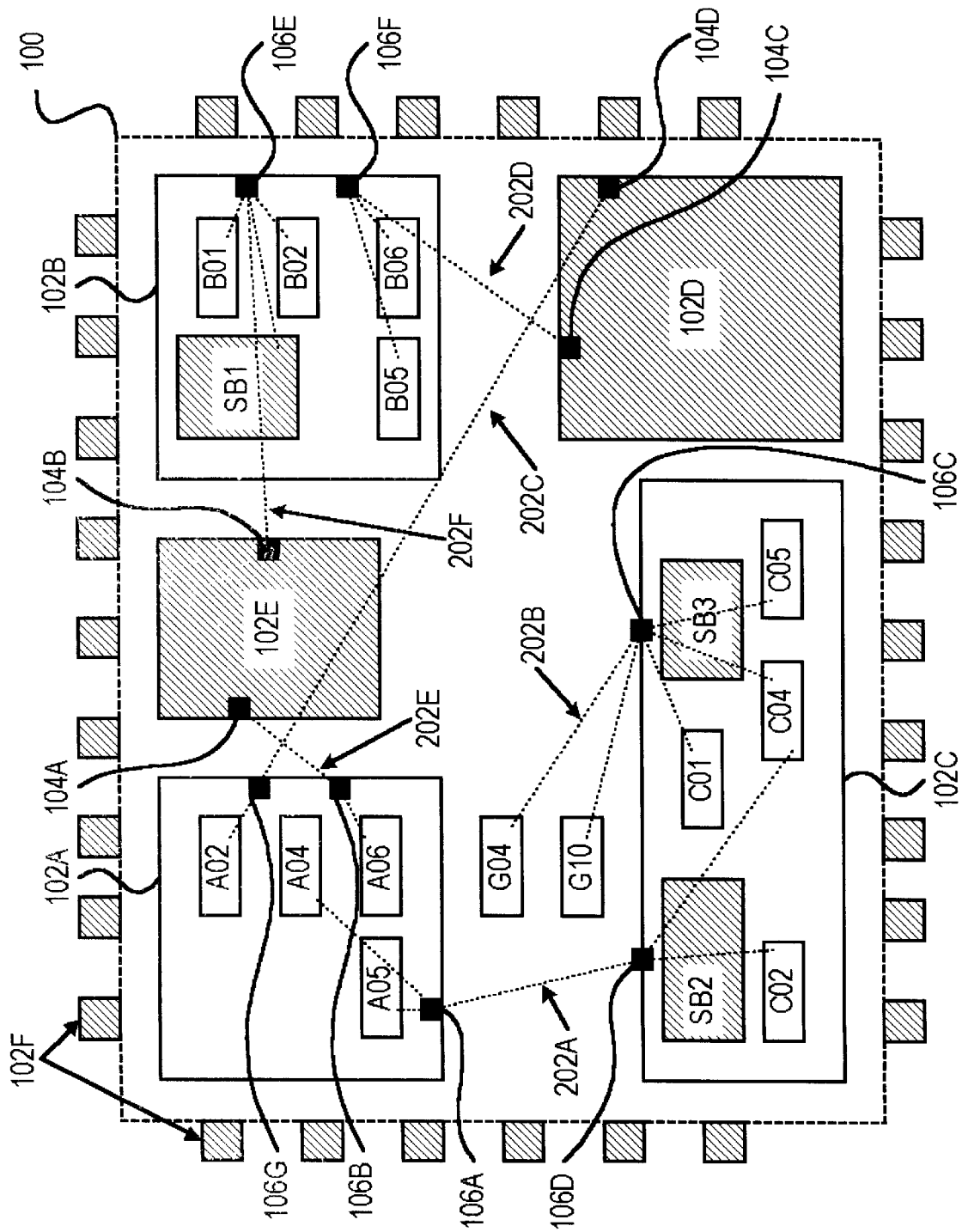
FIG. 3 is a block diagram of a circuit which displays connections through nets of circuit design of FIG. 1 and FIG. 2.

In step 1004 (FIG. 10), CAD application 2042 (FIG. 20) searches for all nets that connect to any of soft blocks. As used herein, a net refers to an interconnection, e.g., an electrically shorted wire, which connects pins of respective components. As is shown in FIG. 3, net 202A is an interconnection which connects pins 106A and 106D. In soft block 102A, pin 106A connects components A04 and A05 in soft block 102A. Pin 106D connects components C02 and C04 in soft block 102C. Hence, net 202A links components A04 and A05 of soft block 102A and components C02 and C04 of soft block 102C into the same point logically. Similarly, net 202B connects components C01, C04 and C05 of soft block 102C and components G04 and G10 of high level into the same point logically. Net 202C connects pin 104D of hard block 102D and component A02 of soft block 102A. Net 202D connects pin 104C of hard block 102D and components B05 and B06 of soft block 102B. Net 202E connects pin 104A of hard block 102E with component A06 of soft block 102A. Net 202F connects pin 104B of hard block 102E with components B01 and B02 of soft block 102B. For clarity, components that do not connect to nets 202A–F are not shown in FIG. 3 and later figures. Nets 202A–F (FIG. 3) are illustrative examples. CAD application 2042 (FIG. 20) represents nets 202A–F in memory in a conventional list structure. In this example, the list structure is named "NETS" and the NETS list stores nets 202A–F in the following form:

NETS[0]=202A

NETS[1]=202B

NETS[2]=202C

NETS[3]=202D

NETS[4]=202E

NETS[5]=202F

In NETS, NETS[0] represents the first element of NETS list, NETS[1] represents the second element of list NETS and so on.

In step 1006 (FIG. 10), CAD application 2042 (FIG. 20) sorts nets in list NETS according to timing delay constraints if there are any time constraints or otherwise according to Manhaton distance length determination techniques. Manhaton distance length determination techniques are known and are not described further herein. The NETS list is sorted such that the nets with tighter timing delay constraints or longer length are processed prior to nets with looser timing delay constraints or shorter lengths.

Figure 20:
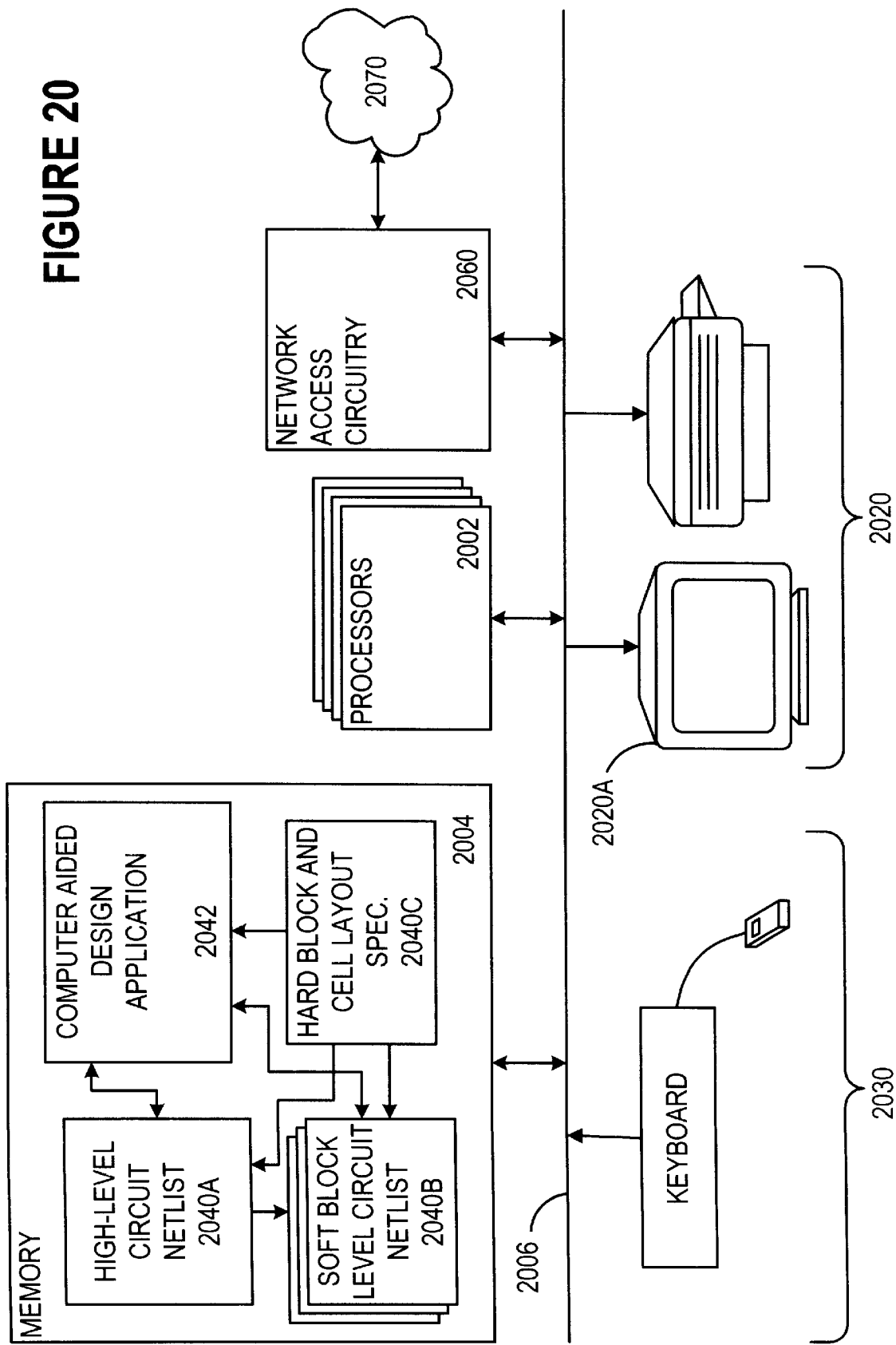
FIG. 20 is a block diagram of a computer network in which the present CAD system works.

Measurement of Manhaton distance length of a net is limited on the high-level circuit netlist 2040A FIG. 20) and does not consider circuitry inside soft blocks. The distance length measures starting from a signal driving pin to signal driven pins. As used herein, the term "driving pin" refers to a pin representing an electrical current source for the net, and "driven pin" refers to a pin receiving electrical current.

Figure 11:
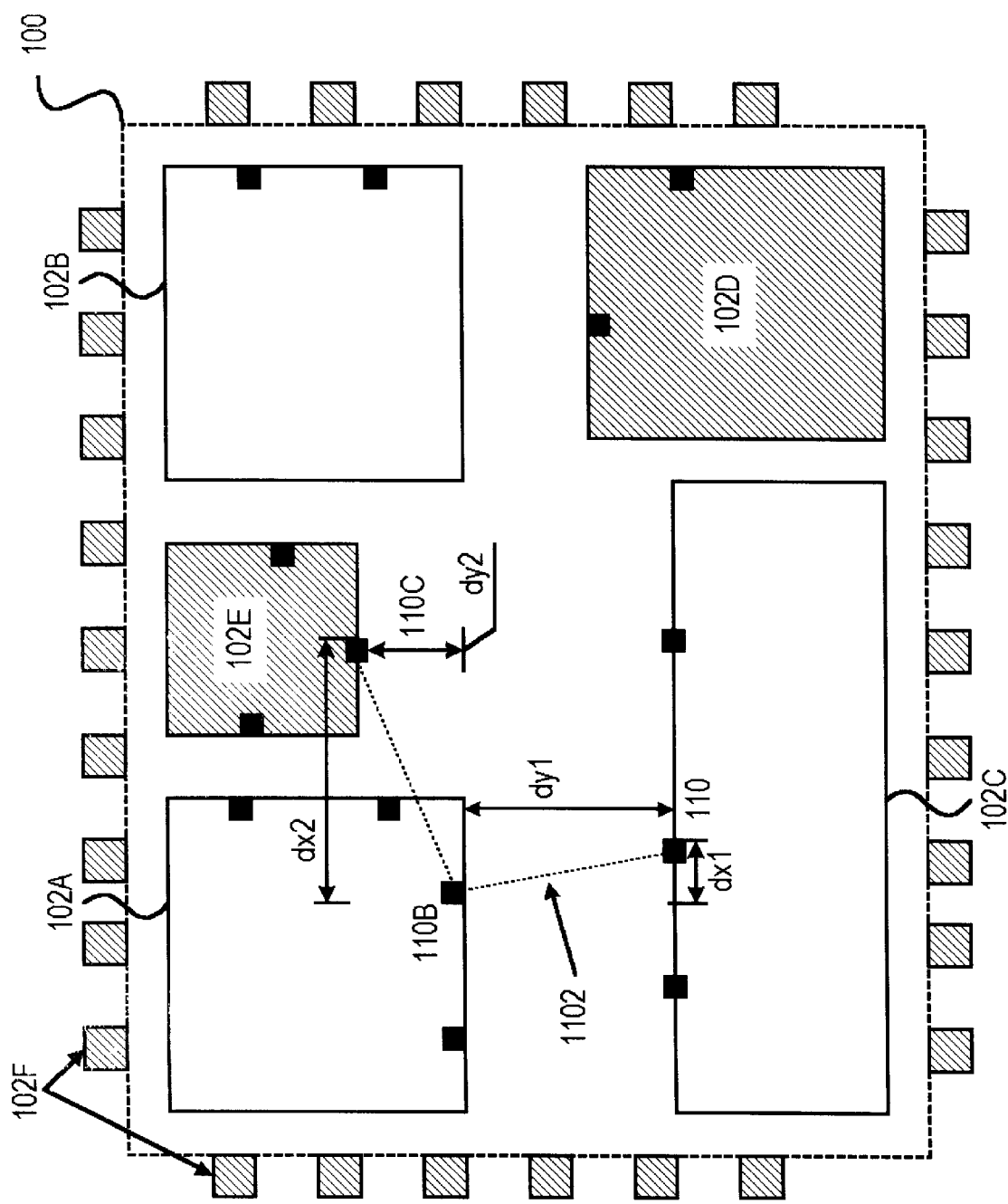
FIG. 11 is a block diagram which shows how to measure distance length of a net.

FIG. 11 illustrates measurement of the Manhaton distance length for a net. Net 1102 (FIG. 11) connects pins 110A, 110B and 110C. Pin 110A is a driving pin while pin 110B and 110C are driven pins. The first step of measurement is to find the driving pin 110A (FIG. 11) in this example. CAD application 2042 (FIG. 20) identifies pin 110A (FIG. 11) according to pin direction information from soft block circuit netlist 2040B (FIG. 20) and hard block and cell layout specification 2040C (FIG. 20). From pin 110A (FIG. 11) to any of other pins in the same net, e.g., 110B, the Manhaton distance length is (dx1+dy1). CAD application 2042 (FIG. 20) similarly measures other driving-driven pin pairs. The length in this example is (dx2+dy2) from pin 110B to pin 110C. The total length of the net is the sum of lengths of all pin pairs that measured in the manner described above. The total length of net 1102 (FIG. 11) is (dx1+dy1+dx2+dy2) in this example. The nets in list NETS might be re-ordered from the order given above after step 1006 (FIG. 10).

In step 1008 (FIG. 10), CAD application 2042 (FIG. 20) calculates density centers for pins of soft blocks and core cells. Diagram 1200 (FIG. 12) shows the process flow of calculating density centers for soft block pins and core cells. The density center is an electrical weight center among various weighted pins and is calculated by the following formula:

$$X_c = \Sigma X_i C_i R_i E_i / \Sigma C_i R_i E_i \quad (1)$$

$$Y_c = \Sigma Y_i C_i R_i E_i / \Sigma C_i R_i E_i \quad (2)$$

Where i ranges from 1 to n, in which n denotes the number of pins, $X_i$ and $Y_i$ denote the coordinate of the $i^{th}$ pin, $C_i$ and $R_i$ are the capacitance and resistance, respectively, of the $i^{th}$ pin, while $E_i$ is the other electrical parameter factor of the $i^{th}$ pin. As shown in equation (1), all $X_i$ are accumulated with respective weight factors and divided by the total weight to determine the density center in x-axis direction. Equation (2) shows the same for all $Y_i$. Hence, the $X_c$ and $Y_c$ are the coordinate of the density center in x-axis and y-axis, respectively, of pins 1 through n. Equations (1) and (2) are effectively applied to driven pins in general because driving pin is a single pin in most of cases. Coordinates calculated by equations (1) and (2) are generally closer to the coordinates of pins with high loading. Accordingly, skew of timing delay among the driven pins can be effectively reduced. Logic flow diagram 1200 (FIG. 12) illustrates the calculation of density center.

Figure 12A:
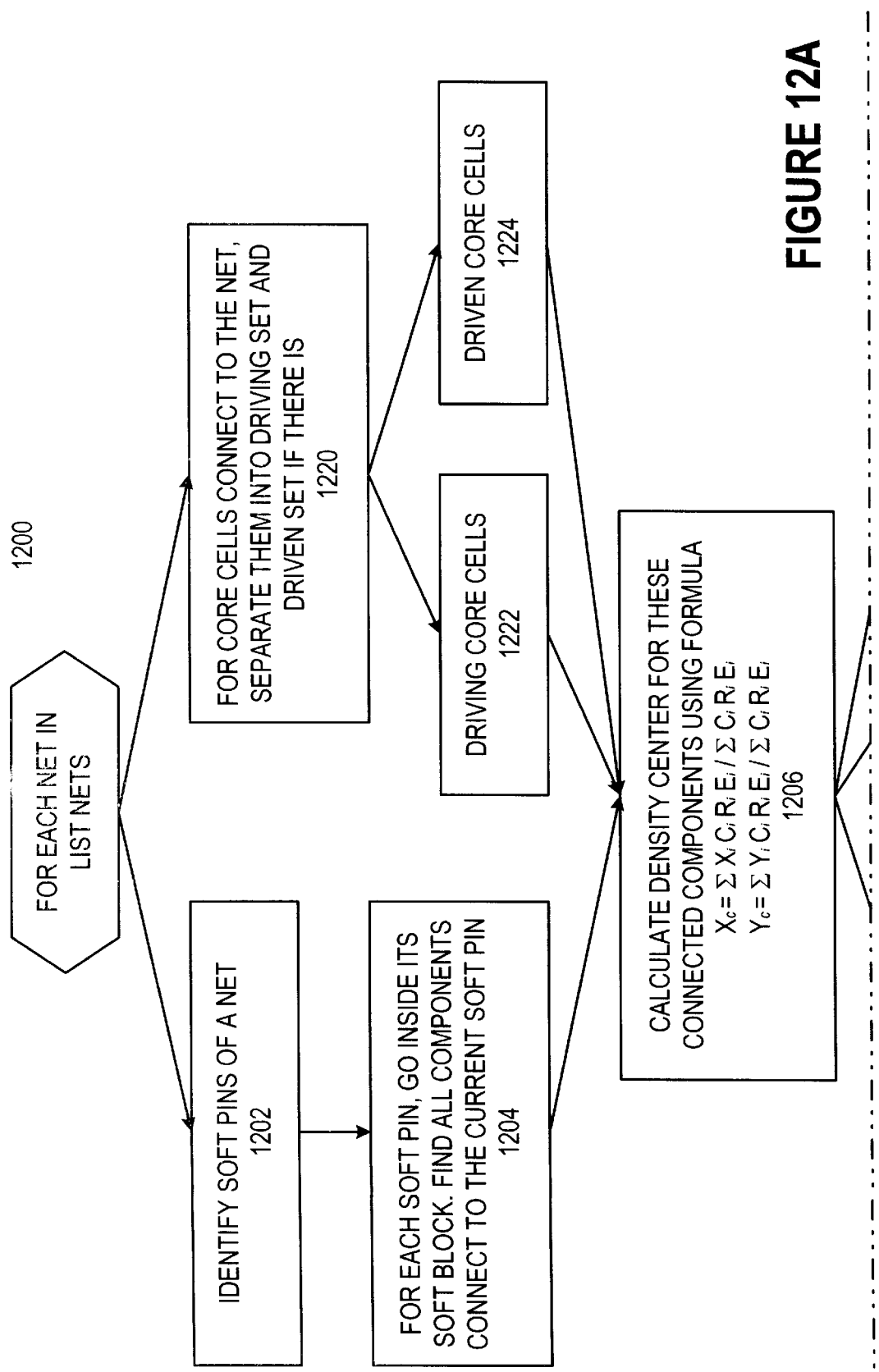
FIG. 12 is a process flow diagram which shows the procedures to make electrical density center for pins.
Figure 12B:
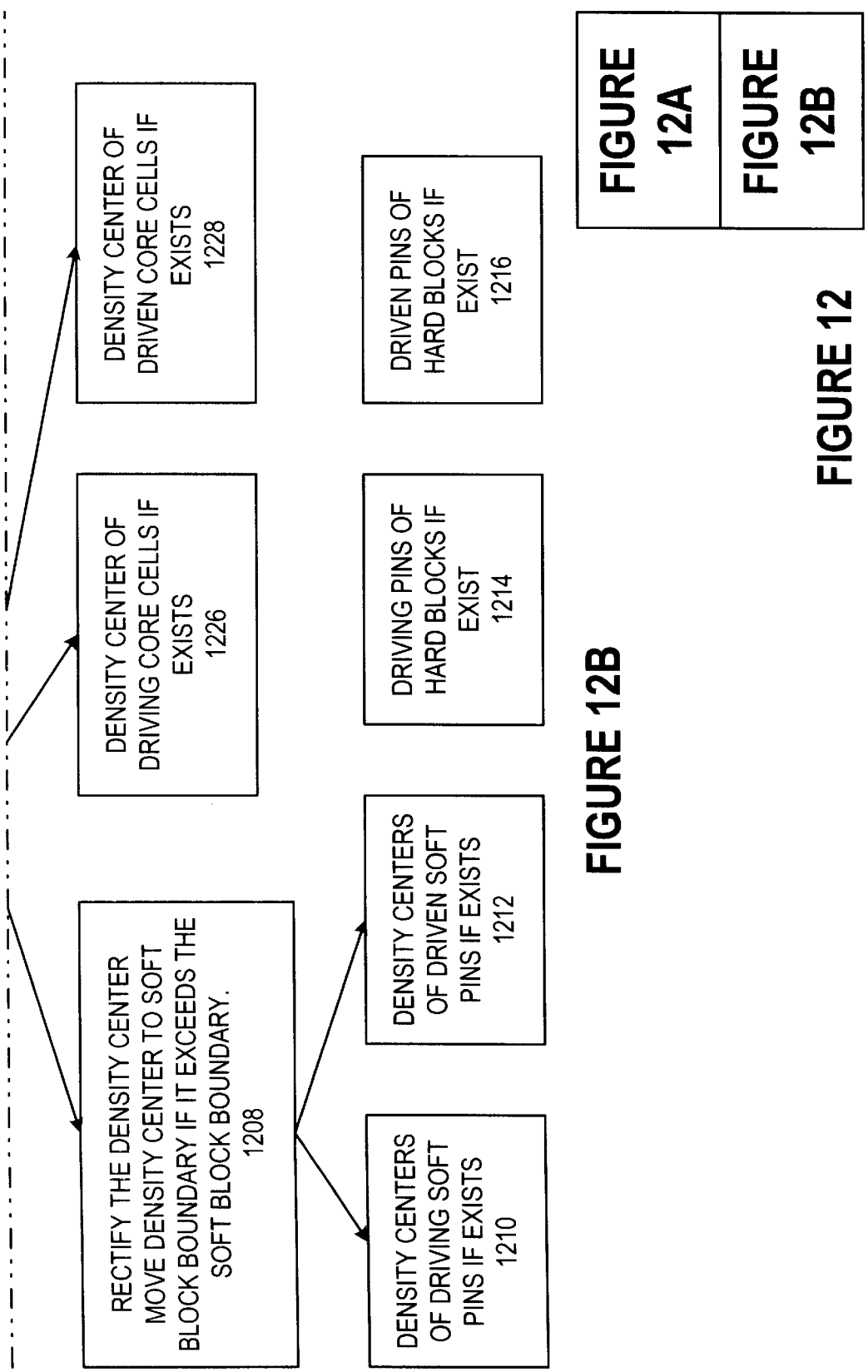

In logic flow diagram 1200 (FIG. 12), CAD application 2042 (FIG. 20) processes nets one-by-one in the order of net list NETS described above. For each net, CAD application 2042 identifies soft pins of the current net as shown at step 1202 (FIG. 12). If the current pin on the net is a pin of a soft block, all components connected to the current pin are retrieved from the soft block netlist, e.g., soft block level circuit netlist 2040B (FIG. 20), in step 1204 (FIG. 12). CAD application 2042 FIG. 20) calculates the density center for pins of the current net using components found in step 1204 and equations (1) and (2) to determine the density center $X_c$ and $Y_c$ of a particular pin.

Figure 4:
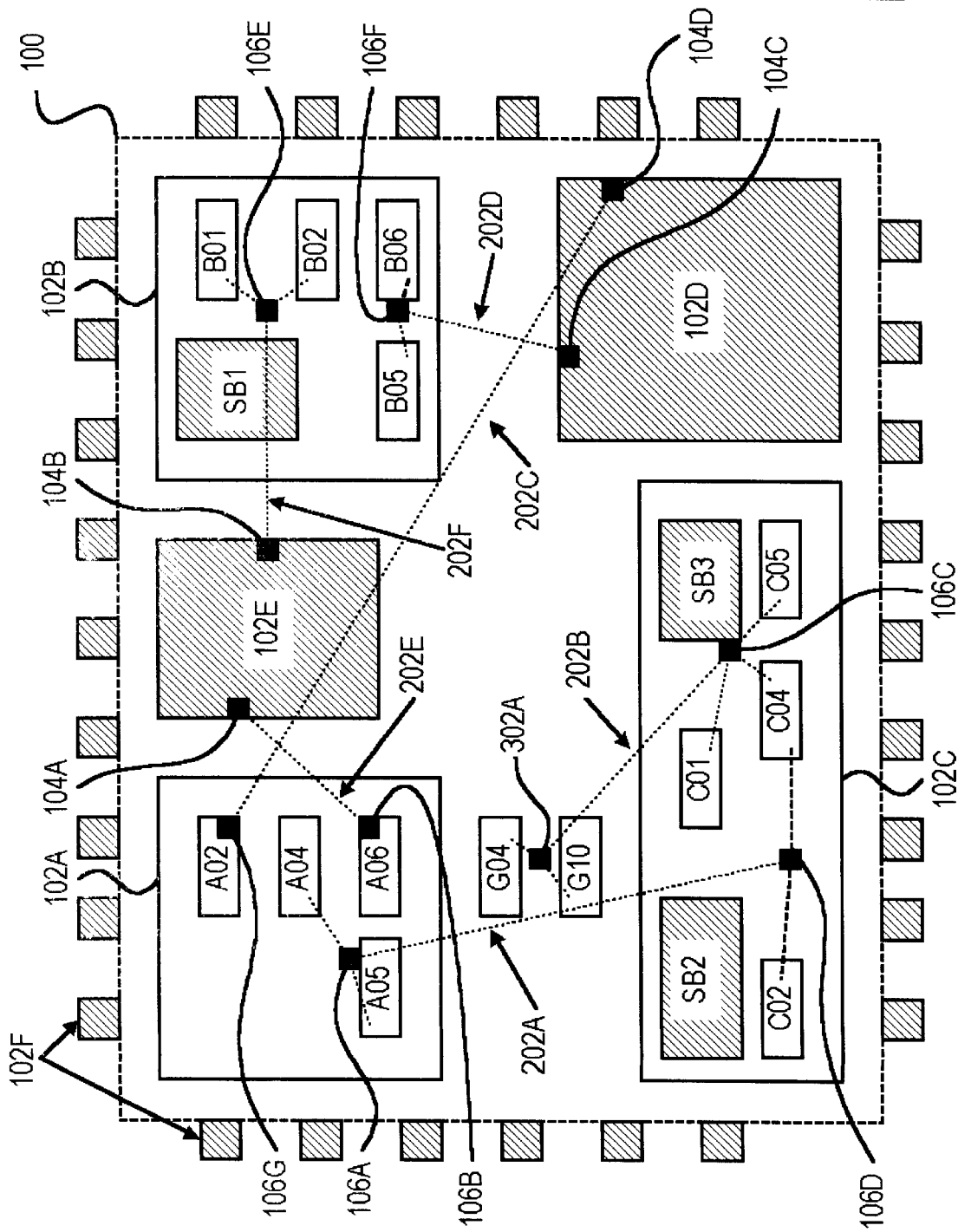

The following example described in the context of FIG. 3 is illustrative. Net 202A connects pin 106A of soft block 102A and pin 106D of soft block 102C. CAD application 2042 (FIG. 20) finds soft pins 106A (FIG. 3) and 106D according to step 1202 (FIG. 12). In step 1204, CAD application 2042 (FIG. 20) looks within soft block 102A (FIG. 3) of pin 106A and finds components A04 and A05 connected to pin 106A. CAD application 2042 (FIG. 20) calculates the density center of components A04 (FIG. 3) and A05 using equations (1) and (2). The density center is located somewhere between A04 and A05. This density center is the new location of pin 106A as is shown in FIG. 4. Similarly, the new location of pin 106D is shown in FIG. 4.

CAD application 2042 (FIG. 20) adjusts the density center onto soft block boundary if it is located outside its soft block in step 1208 (FIG. 12). In steps 1210–1212, CAD application 2042 (FIG. 20) marks the current soft pin as a driving pin or driven pin.

The calculation of the density center of a core cell according to logic flow diagram 1200 (FIG. 12) starts in step 1220. The core cell pins of a net are the pins on the net other than soft pins and hard block pins. For example, net 202B contains pin 106C and core cells G04 and G10 (FIG. 3). In this example, the rest are core cells G04 and G10 are the core cell pins of net 202B. Among the core cells, CAD application 2042 (FIG. 20) classifies them into two groups—(i) the driving core cell group and (ii) the driven core cell group—according to steps 1222 and 1224 (FIG. 12). An empty group represents zero components in this group. In this illustrative example, core cells G04 and G10 are the driven core cell group and the driving core cell group is an empty group since core cells G04 and G10 are driven by soft pin 106C, which is not a core cell.

CAD application 2042 (FIG. 20) calculates the density centers for both groups, i.e, the driven and driving groups, in step 1206 using equations (1) and (2). The resulting density center of the driven core cell group is a core cell density center 302A as shown in FIG. 4. The driving core cell group is empty in this example. CAD application 2042 (FIG. 20) marks the density center(s) as either driving or driven in steps 1226 and 1228 (FIG. 12). According to logic flow diagram, all core cells of a net are now simplified as one driving source and/or one driven device.

After completion of processing according to logic flow diagram 1200, connections in a net are simplified as two (2) core devices at most, zero or more soft pins and zero or more hard pins. The demonstrated result is shown in FIG. 4. Net 202A connects soft pins 106A and 106D in new locations. Net 202B connects soft pin 106C at a new location and core cell density center 302A. Net 202C connects pin 104D of hard block 102D and soft pin 106G in a new location. Net 202D connects hard block pin 104C and soft block pin 106F in a new location. Net 202E connects hard block pin 104A and soft block pin 106B in a new location. Finally in this illustrative example, net 202F connects hard block pin 104B and soft block pin 106E in a new location.

Figure 5:
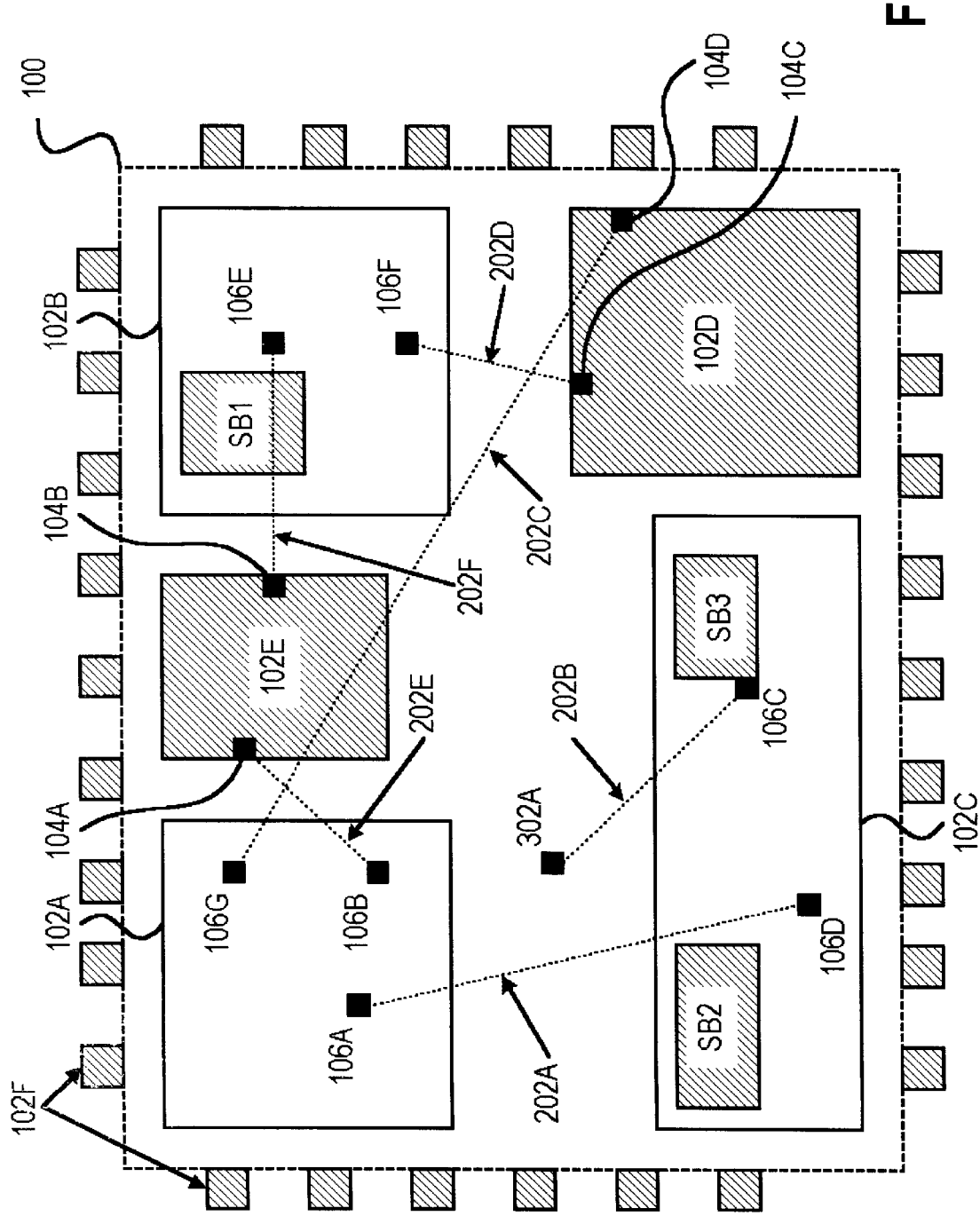
FIG. 5 is a simplified representation of FIG. 4.

The new locations of soft pins 106A–G are nearer components with higher loads and further from components with lower loads as described above. As a result, skew in timing delay between such components is reduced. Accordingly, the new locations of soft pins 106A–G significantly reduce timing delay skew. FIG. 5 shows the nets of FIG. 4 without high-level core cell information and without component information within the soft blocks. Such information is removed from FIG. 5 and subsequent figures for simplification and clarity.

Pin optimization described above can be further optimized to reduce blockage in the optimized nets. Blockage refers to obstruction of wiring connections using specific routing layers during a place and route phase of circuit layout determination. For example, one semiconductor process can have five (5) routing layers that are, for example, metal-1, metal-2, metal-3, metal-4 and metal-5. The layers are insulated from one another in semiconductor processes. Electrical connection of different layers is accomplished through a conventional technique generally referred to as the "via" technique. A "via" is a square shape figure of conducting material and makes a short between two conducting layers through an insulating. For example, to short metal-1 and metal-2, a via-1–2 connects metal-1 layer wires and metal-2 layer wires. Conventional place and route software tools can use these five (5) different conducting materials to lay wires to realize connections of all nets. To preserve the various nets as distinct, different nets cannot be shorted electrically to one another in general. Wires in a single layer will short if the wires contact one another. Hence, an earlier laid wire becomes an obstruction for other, subsequently-laid wire using the same layer.

A hard block has layout completed using certain layers for the constituent components and wires. Consider, for example, a hard block laid out in the three layers of metal-1, metal-2, and metal-3 were used to its layout. This hard block would obstruct the layers of metal-1, metal-2, and metal-3. In other words, wires within layers metal-1, metal-2, and metal-3 are not allowed to he in the same area covered by the hard block.

For soft blocks, certain routing layers, e.g., the first three layers of metal-1, metal-2, and metal-3, are reserved although they have not been used for layout. Any routing using these layers shall avoid routing wire through the soft blocks.

In current semiconductor industry, three (3) to five (5) layer processes are most common. As shown in FIG. 5, hard block 104A and 104B obstruct regions in certain layers, e.g., metal-1, metal-2 and metal-3. Information regarding the particular areas and layers obstructed by various hard blocs is stored in hard block and core cell layout specification 2040C (FIG. 20). In the following illustrative example, it is assumed that sub-hard block SB1, SB2 and SB3 (FIG. 5) are laid in the same layers. Other layers can be used to route wires through the lateral boundaries of hard blocks and/or hard sub-blocks. For example, if circuit design 100 (FIG. 5) uses a 5-layer semiconductor process, CAD application 2042 (FIG. 20) can lay wires freely in layers metal-4 and metal-5 and is restricted only when laying wires in layers metal-1, metal-2, and metal-3. As a result, pins 106A–G can be wired in layers metal-4 and metal-5 without obstructions by hard blocks laid in layers metal-1, metal-2, and metal-3. But if the semiconductor process includes only three routing layers, pins 106A–G are moved to soft block boundaries to be wired without obstruction.

In step 1010 (FIG. 10), CAD application 2042 (FIG. 20) compares the number of free routing layers to a predetermined threshold. In this illustrative embodiment, CAD application 2042 compares the number of free routing layers to five (5). If the number of free routing layers is at least the predetermined threshold, e.g., five (5), CAD application 2042 finishes the optimization process by recording the already determined new locations for soft pins 106A–G and reports these results in step 1018 (FIG. 10). Otherwise, if the number of free routing layers is not at least five (5), CAD application 2042 (FIG. 20) moves the soft pins to boundaries of respective soft blocks in blockage minimization processing of steps 1012–1016 (FIG. 10). The number of obstruction layers of soft block is set to three (3) layers as a default and can be adjusted in CAD application 2042 (FIG. 20) using conventional user interface techniques.

Figure 13A:
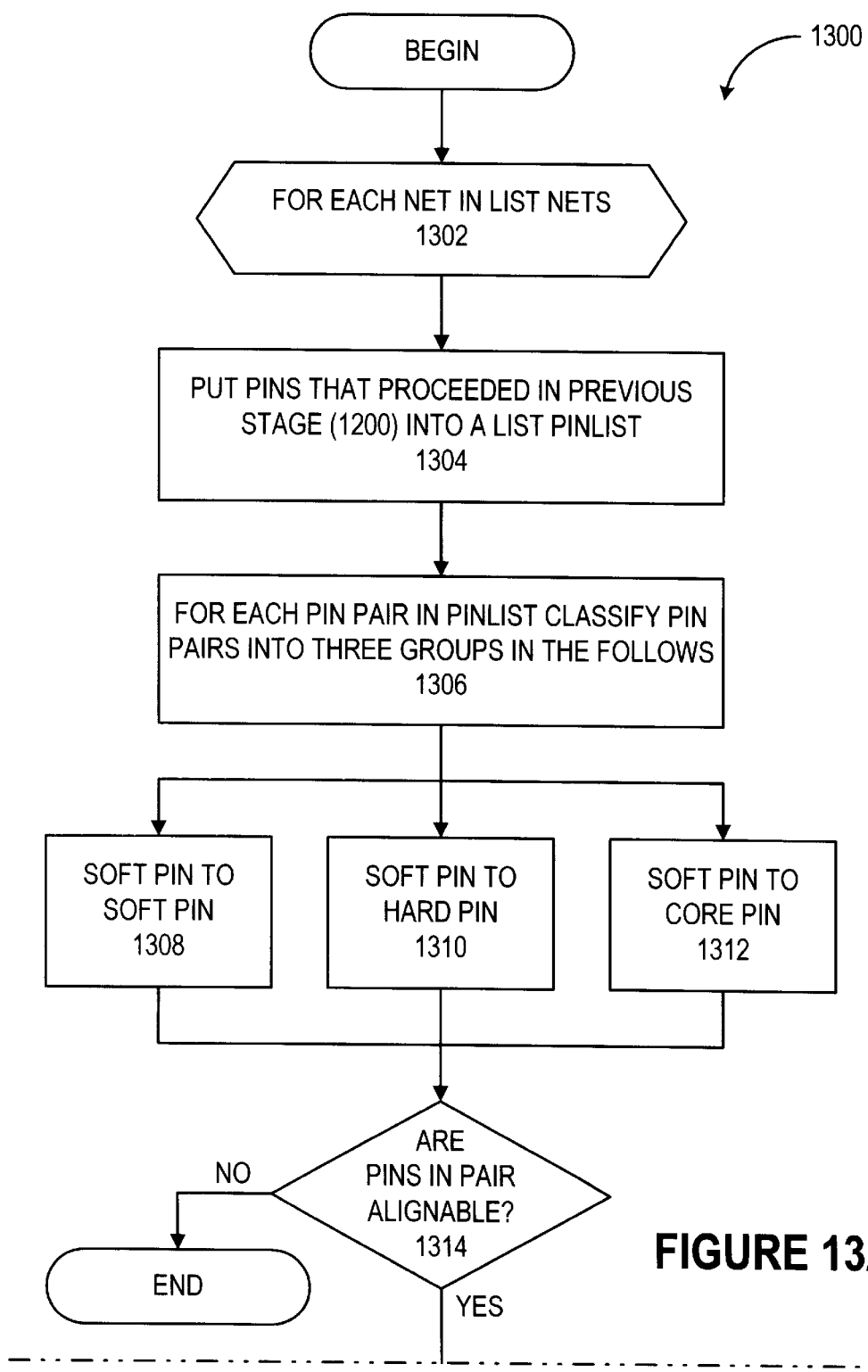
FIG. 13 is a process flow diagram which shows the procedures of pin alignment.
Figure 13B:
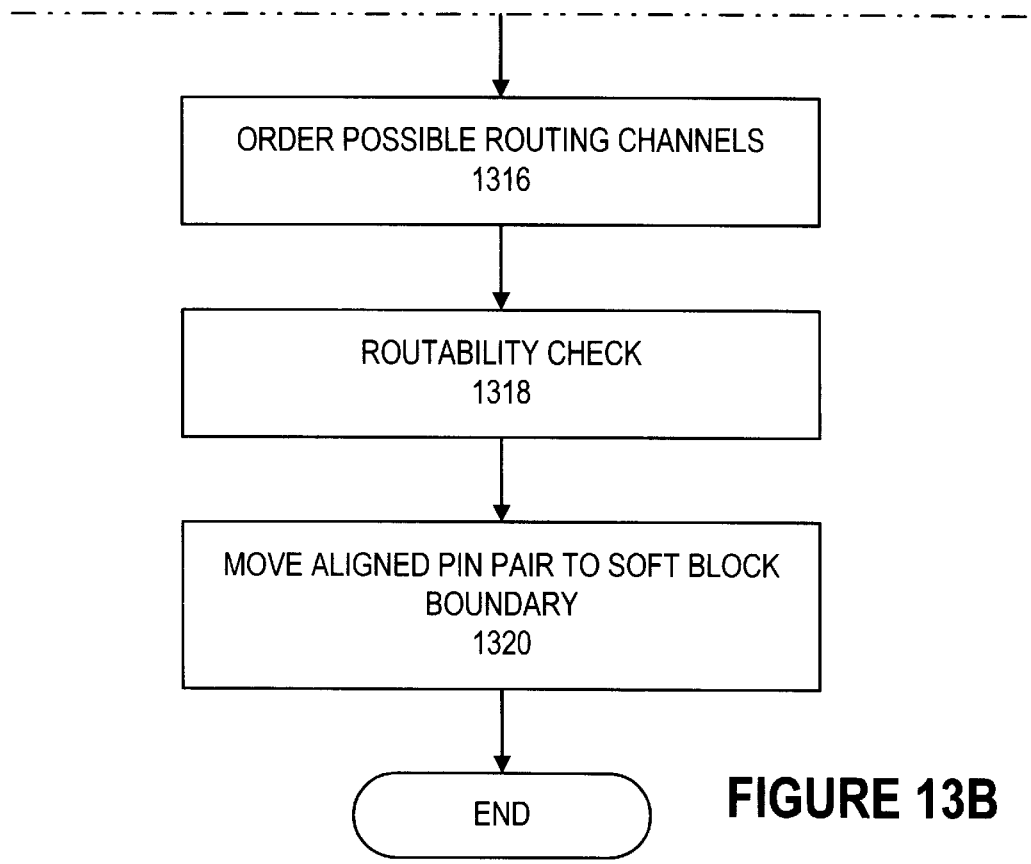
Figure 13:
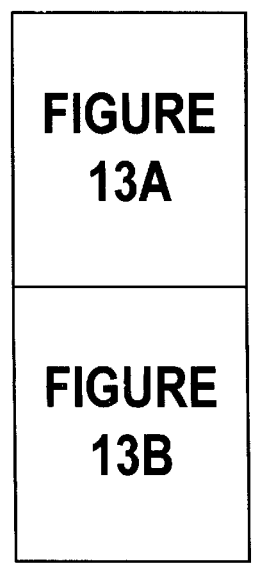

In step 1012 (FIG. 10), CAD application 2042 (FIG. 20) processes pin alignment between pins of soft blocks, hard blocks, and core cells. Diagram 1300 (FIG. 13) shows the alignment optimization for soft pins. CAD application 2042 (FIG. 20) gets a net in list NETS in step 1302 (FIG. 13). CAD application 2042 (FIG. 20) extracts all pins including soft pin density centers, hard pins, and core cell density cells from a net and stores in memory in a list of pins referred to as PINLIST as is shown in step 1304 (FIG. 13). Each pair of pins includes one driving pin and one driven pin such that the driving pin of the pair drives the driven pin of the pair. CAD application 2042 (FIG. 20) makes such pin pairs from the pins in PINLIST and classifies pin pairs into three groups (step 1306): soft pin to soft pin pair group (step 1308), soft pin to hard pin pair group (step 1310), and soft pin to core density center pair group (step 1312).

Figure 14:
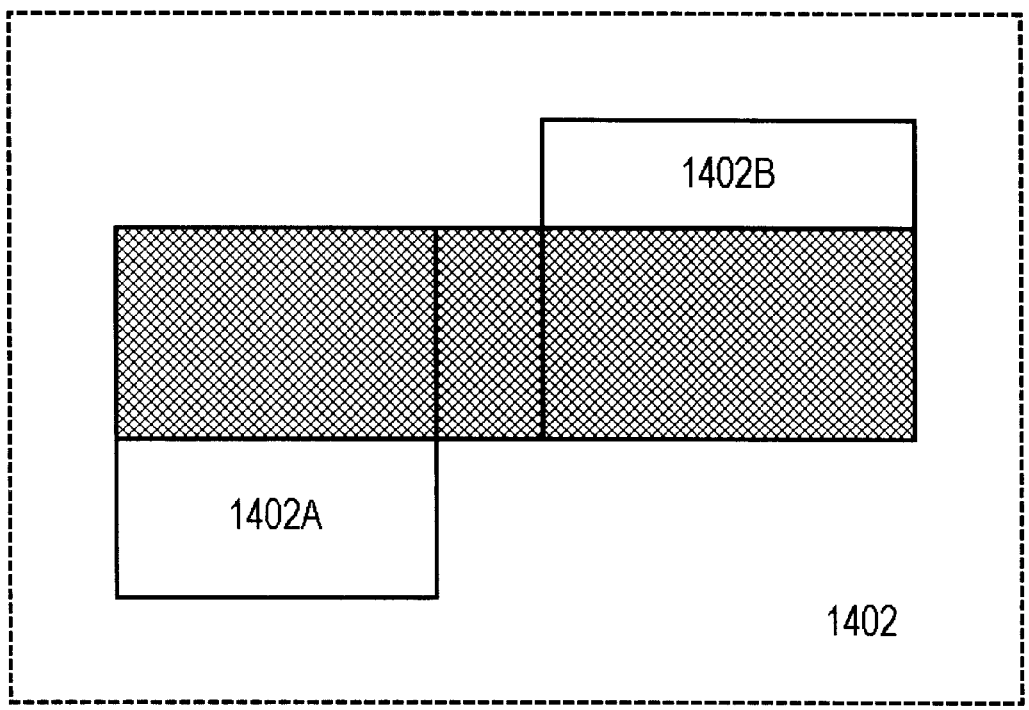
FIGS. 14–19 are block diagrams which illustrate some cases in processing pin alignments.
Figure 15:
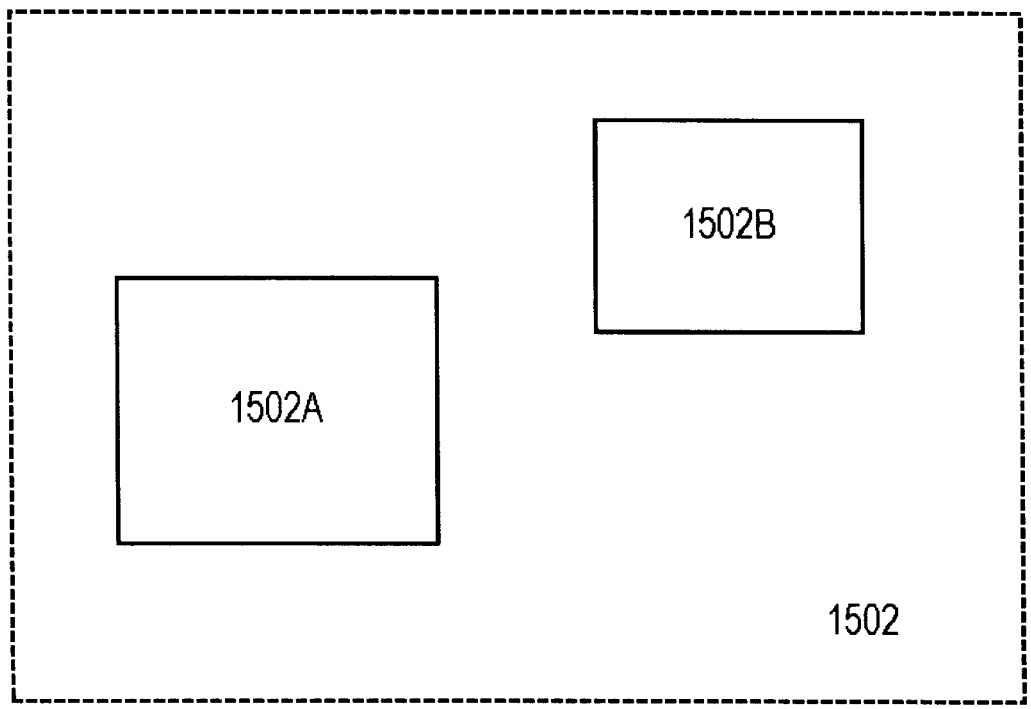

In step 1314 FIG. 13), CAD application 2042 (FIG. 20) checks if a pin pair can be aligned according to a simple rule. The rule is applied as follows. The two pins of the pair define a rectangle region of circuit design 100. If this rectangular region intersects a single boundary of each of the soft blocks in cases of soft pin to soft pin pairs 1308 (FIG. 13) or intersects a single boundary of the soft block in cases of soft pin to hard pin pair 1310 and in the case of soft pin to core pin 1312, the pin pair can be aligned. For example, any pin pair located inside the shaded rectangle region in graph 1402 (FIG. 14) can be aligned. However, graph 1502 (FIG. 15) shows no such region exists. After step 1314 (FIG. 13), pin pairs that can be aligned are processed according to step 1316 (FIG. 13), while others are abandoned, i.e., are not aligned according to logic flow diagram 1300.

Figure 16:
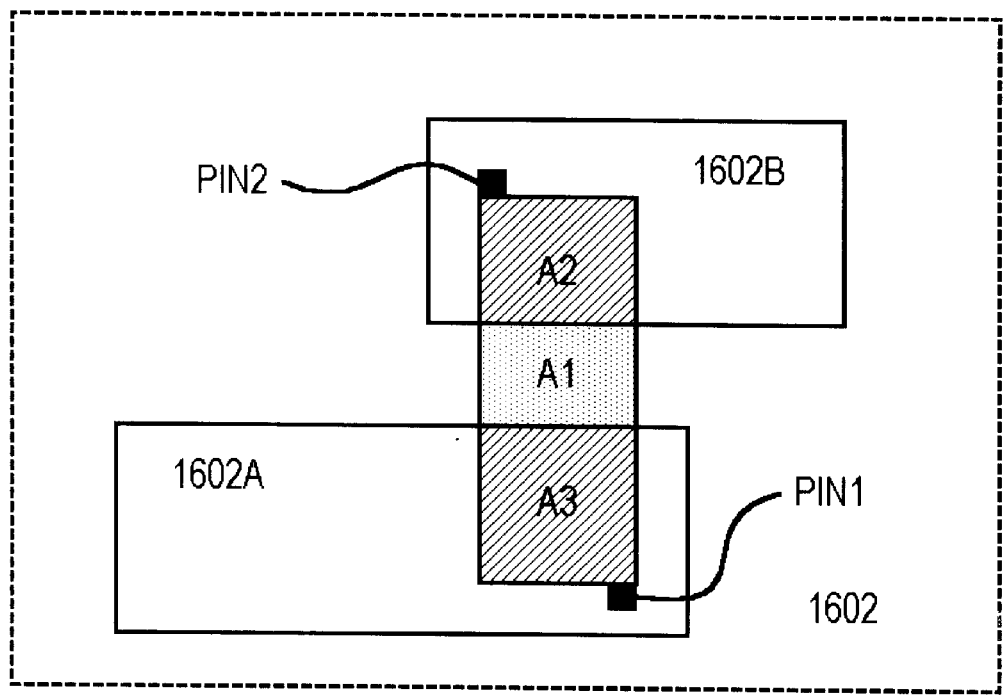

CAD application 2042 (FIG. 20) prepares possible routing channels for a routability check in step 1316. In most of cases, three routing channels are sufficient to check routability of alignment. The three channels are: two, one at each side of formed rectangle region, and one in the middle of the region. Graph 1602 (FIG. 16) shows vertical channels for pin alignment. Two channels are at the vertical edges of regions A1, A2, and A3. A third channel is through the middle of regions A1, A2, and A3. In step 1318 (FIG. 13), CAD application 2042 (FIG. 20) performs routability checking through the three possible channels. CAD application 2042 (FIG. 20) checks the three channels in region A1. If all are blocked, CAD application 2042 (FIG. 20) abandons this pin pair. Otherwise CAD application 2042 (FIG. 20) checks the channels in region A2 and A3. If all channels are fully blocked in region A2 and/or A3, CAD application 2042 (FIG. 20) abandons this pin pair. If the pin pair is not fully blocked, the pin pair can be aligned now.

Figure 17:
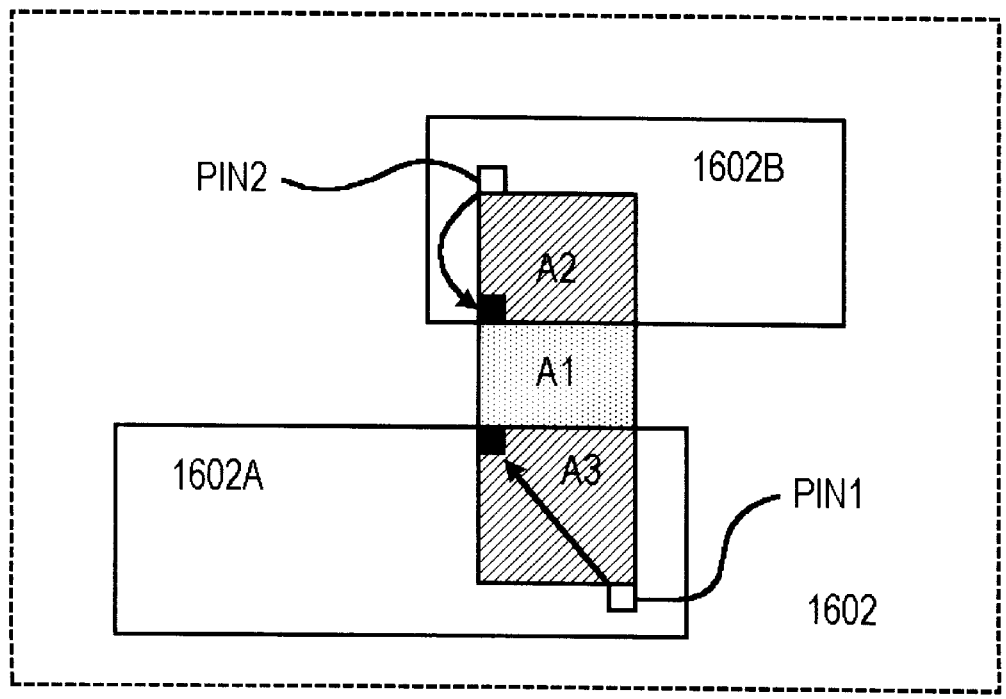
Figure 18:
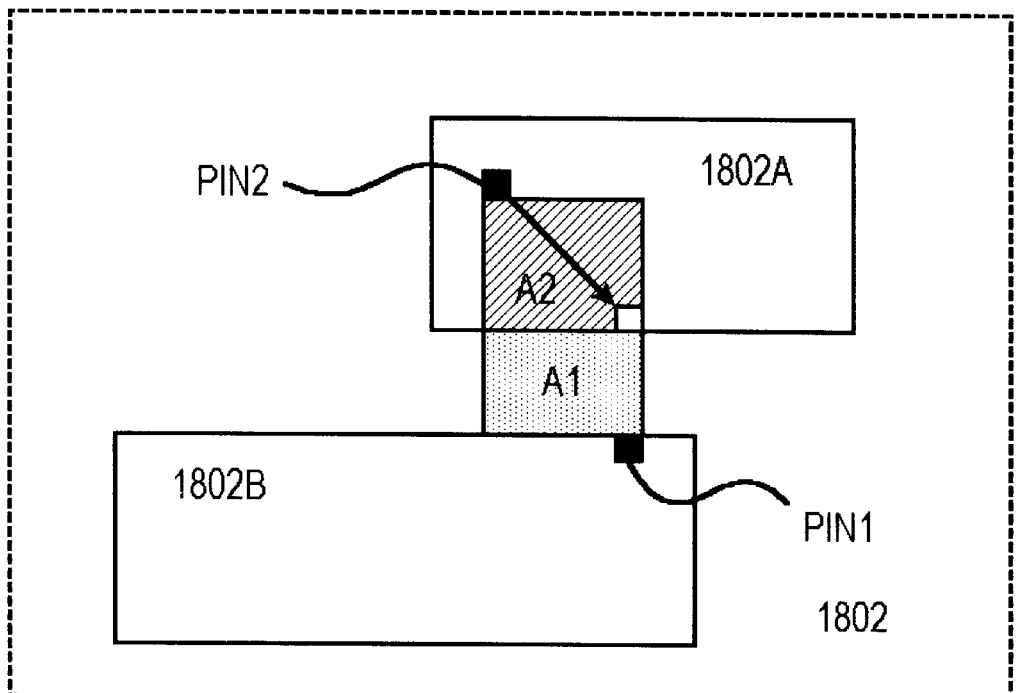
Figure 19:
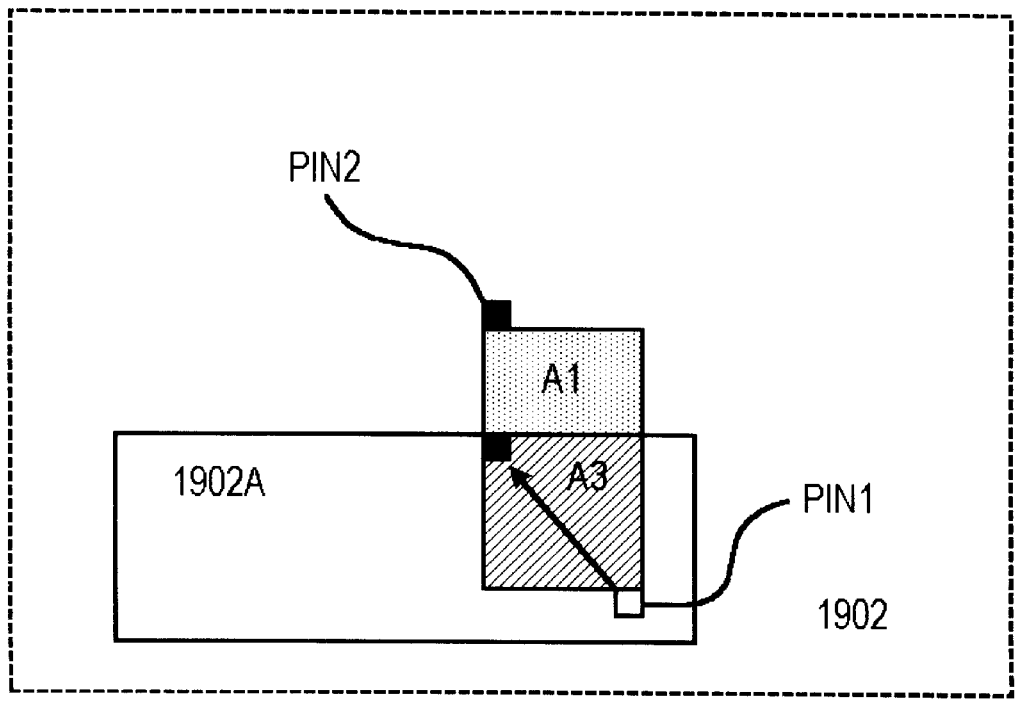

In step 1320 (FIG. 13), CAD application 2042 (FIG. 20) moves pins to their soft block boundaries on aligned locations. Graph 1602 (FIGS. 16 and 17) illustrates the process for soft pin to soft pin alignment; both pins are aligned along a non-blocked channel at soft block boundaries. Graph 1802 (FIG. 18) illustrates the process of soft pin to hard pin alignment. In the case of soft pin to hard pin alignment, hard pin is fixed and only the soft pin is aligned along a non-blocked channel at a soft block boundary. Graph 1902 (FIG. 19) illustrates the process of soft pin to core pin alignment. Core pin is fixed in this case and only the soft pin is aligned along a non-blocked channel at the soft block boundary.

Figure 6:
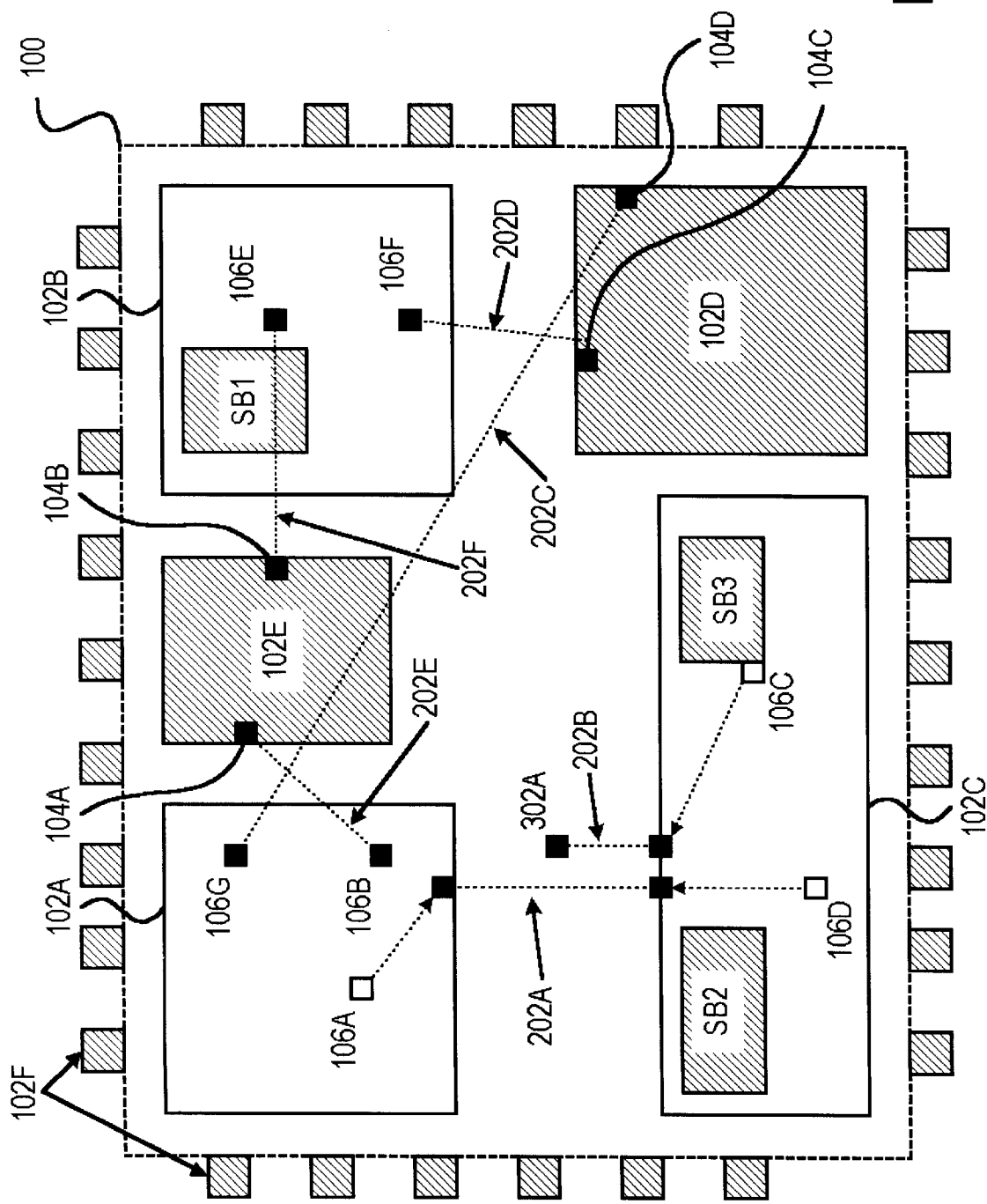
FIG. 6 is a block diagram of a circuit which the some pins are aligned through pin alignment optimization process.
Figure 7:
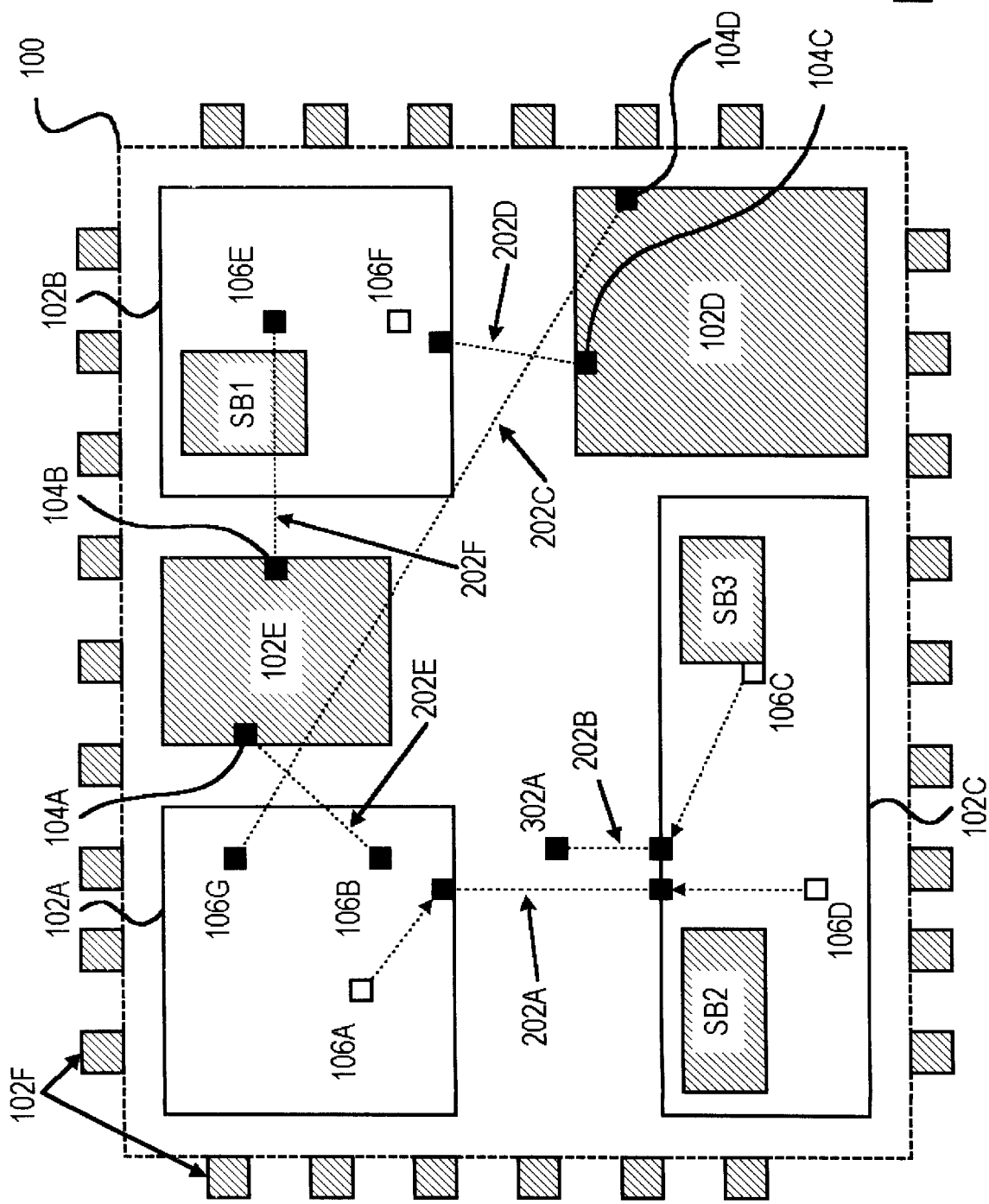
FIG. 7 is a block diagram of a circuit which display pin alignment for soft pin to hard pin case.

As a result of the above processes, some pins in circuit design 100 (FIG. 6) are aligned. For example, pins 106A and 106D of net 202A are aligned as soft pin to soft pin case. Pins 106C and 302A are aligned as soft pin to core pin case in FIG. 6. Pins 106F and 104C are aligned as soft pin to hard pin case in FIG. 7. The remaining pins in this illustrative example are not aligned and left as is.

Figure 8:
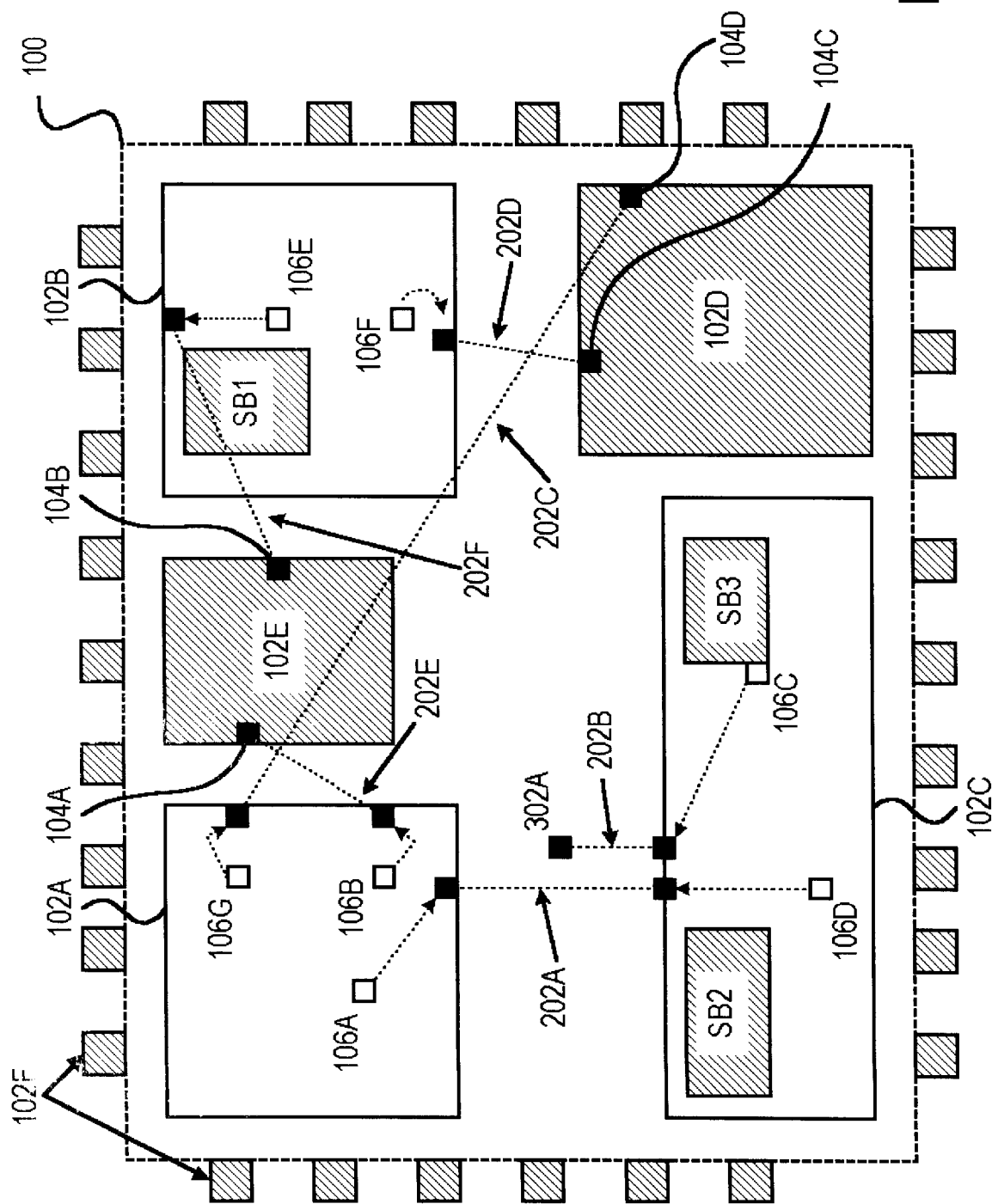
FIG. 8 is a block diagram of a circuit which the non-aligned pins are moved to their soft block boundaries

After step 1012 (FIG. 10) as shown more completely in logic flow diagram 1300 (FIG. 13), CAD application 2042 (FIG. 20) moves the rest of the soft pins that are not aligned in the step 1012 (FIG. 10) to their own soft block boundaries. The guideline to move a soft pin to one of four boundaries is: move the pin to its nearest boundary without blockage. As shown in FIG. 8, pins 106B, 106E, and 106G are moved to their respective block boundaries.

In step 1016 (FIG. 10), CAD application 2042 (FIG. 20) applies conventional techniques to reduce crossover among related net flight lines. In step 1018 (FIG. 10), CAD application 2042 (FIG. 20) updates the positions of soft pins 106A–G (FIG. 9) soft block level circuit netlist 2040B (FIG. 20) and exports the optimized netlist. Thus, processing according to logic flow diagram 1000 completes.

Operating Environment of the CAD Application

In this illustrative embodiment, CAD application 2042 (FIG. 20) is all or part of one or more computer processes executing within a computer system 2000 as shown in FIG. 20. Computer system 2000 includes one or more processors 2002 and memory 2004 which is coupled to processors 2002 through an interconnect 2006. Interconnect 2006 can be generally any interconnect mechanism for computer system components and can be, e.g., a bus, a crossbar, a mesh, or a hypercube. Processors 2002 fetch from memory 2004 computer instructions and execute the fetched computer instructions. In addition, processors 2002 can fetch computer instructions through a computer network 2040 through network access circuitry 2060 such as a modem or ethernet network access circuitry. Processors 2002 also read data from and write data to memory 2004 and send data and control signals through interconnect 2006 to one or more computer display devices 2020 and receive data and control signals through interconnect 2006 from one or more computer user input devices 2030 in accordance with fetched and executed computer instructions.

Memory 2004 can include any type of computer memory and can include, without limitation, randomly accessible memory (RAM), read-only memory (ROM), and storage devices which include storage media such as magnetic and/or optical disks. Memory 2004 includes CAD application 2042 which is all or part of one or more computer processes which in turn execute within processors 2002 from memory 2004. A computer process is generally a collection of computer instructions and data which collectively define a task performed by computer system 2000. Memory 2004 also includes high-level circuit netlist 2040A, soft block level circuit netlist 2040B, and hard block and core cell circuit layout specification 2040C.

Each of computer display devices 2020 can be any type of computer display device including without limitation a printer, a cathode ray tube (CRT), a light-emitting diode (LED) display, or a liquid crystal display (LCD). Computer display devices 2020 each receive from processor 2002 control signals and data and, in response to such control signals, display the received data. Computer display devices 2020, and the control thereof by processor 2002, are conventional.

Each of user input devices 2030 can be any type of user input device including, without limitation, a keyboard, a numeric keypad, or a pointing device such as an electronic mouse, trackball, lightpen, touch-sensitive pad, digitizing tablet, thumb wheels, joystick, or voice recognition device. Each of user input devices 2030 generates signals in response to physical manipulation by a user and transmits those signals through interconnect 2006 to processors 2002.

As described above, CAD application 2042 executes within processors 2002 from memory 2004. Specifically, CAD application 2042 is all or part of one or more computer processes executing within computer system 2000, i.e., processors 2002 fetch computer instructions of CAD application 2042 from memory 2004 and execute those computer instructions. Processors 2002, in executing CAD application 2042, optimizes respective locations of pins 106A–G on soft blocks 102A–C (FIG. 4 or FIG. 9) of circuit design 100 in the manner described above. As a result, each of pins 106A–G of soft blocks 102A–C are located so that the routing complexity and electrical signal timing delay can be minimized on the high-level circuit 2040A and skews of electrical signal timing delay to core cells A01–06, B01–06 and C01–05 (FIG. 2) inside soft block circuits 102A–C can be minimized.

The above description is illustrative only and is not limiting. The present invention is limited only by the claims which follow.

What is claimed is:

1. A method for improving locations of one or more pins of a soft block of a circuit design which includes one or more circuit blocks, the method comprising:

for each subject one of the one or more pins,
(i) determining that one or more components of the circuit design are connected to the subject pin;
(ii) locating a circuit density center of the one or more components; and
(iii) assigning the circuit density center as a new location of the pin.

2. The method of claim 1 wherein locating a circuit density center comprises:

determining the circuit density center according to capacitance and resistance of the components.

3. The method of claim 1 further comprising:

for each subject one of the one or more pins,
(iv) moving the subject pin to an aligned location along a boundary of a selected one of the one or more circuit blocks which corresponds to the subject pin wherein the aligned position is relative to the new location of the subject pin.

4. The method of claim 3 wherein (iv) moving comprises:

determining that a signal wire can be routed through the circuit design between the subject pin at the aligned position and a connected pin prior to moving the subject pin.

5. A computer readable medium useful in association with a computer which includes a processor and a memory, the computer readable medium including computer instructions which are configured to cause the computer to improve locations of one or more pins of a soft block of a circuit design which includes one or more circuit blocks by:

for each subject one of the one or more pins,
(i) determining that one or more components of the circuit design are connected to the subject pin;
(ii) locating a circuit density center of the one or more components; and
(iii) assigning the circuit density center as a new location of the pin.

6. The computer readable medium of claim 5 wherein locating a circuit density comprises:

determining the circuit density center according to capacitance and resistance of the components.

7. The computer readable medium of claim 5 wherein the computer instructions are configured to cause the computer to improve locations of one or more pins of a soft block of a circuit design which includes one or more circuit blocks by also:

for each subject one of the one or more pins,
(iv) moving the subject pin to an aligned location along a boundary of a selected one of the one or more circuit blocks which corresponds to the subject pin wherein the aligned position is relative to the new location of the subject pin.

8. The computer readable medium of claim 7 wherein (iv) moving comprises:

determining that a signal wire can be routed through the circuit design between the subject pin at the aligned position and a connected pin prior to moving the subject pin.

9. A computer system comprising:

one or more processors;
a memory operatively coupled to the processors; and
a pin location improvement module (i) which executes in the processors from the memory and (ii) which, when executed by the processors, causes the computer system to improve locations of one or more pins of a soft block of a circuit design which includes one or more circuit blocks by:

for each subject one of the one or more pins,
(i) determining that one or more components of the circuit design are connected to the subject pin;
(ii) locating a circuit density center of the one or more components; and
(iii) assigning the circuit density center as a new location of the pin.

10. The computer system of claim 9 wherein locating a circuit density center comprises:

determining the circuit density center according to capacitance and resistance of the components.

11. The computer system of claim 9 wherein the pin location improvement module is configured to cause the computer system to improve locations of one or more pins of a soft block of a circuit design which includes one or more circuit blocks by also:

for each subject one of the one or more pins,
(iv) moving the subject pin to an aligned location along a boundary of a selected one of the one or more circuit blocks which corresponds to the subject pin wherein the aligned position is relative to the new location of the subject pin.

12. The computer system of claim 11 wherein (iv) moving comprises:

determining that a signal wire can be routed through the circuit design between the subject pin at the aligned position and a connected pin prior to moving the subject pin.

13. A method for designing a circuit which includes one or more circuit blocks, the method comprising:

determining that an inside element of a subject one of the one or more circuit blocks is to be connected to an outside element which is outside the subject circuit block; and logically connecting the inside element with the outside element by:
(i) logically placing a pin within the subject block;
(ii) logically connecting the inside element to the pin; and
(iii) logically connecting the outside element to the pin.

14. A computer readable medium useful in association with a computer which includes a processor and a memory, the computer readable medium including computer instructions which are configured to cause the computer to facilitate designing a circuit which includes one or more circuit blocks by:

determining that an inside element of a subject one of the one or more circuit blocks is to be connected to an outside element which is outside the subject circuit block; and logically connecting the inside element with the outside element by:
(i) logically placing a pin within the subject block;
(ii) logically connecting the inside element to the pin; and
(iii) logically connecting the outside element to the pin.

15. A computer system comprising:

one or more processors;

a memory operatively coupled to the processors; and a pin location improvement module (i) which executes in the processors from the memory and (ii) which, when executed by the processors, causes the computer system to facilitate designing a circuit which includes one or more circuit blocks by:

determining that an inside element of a subject one of the one or more circuit blocks is to be connected to an outside element which is outside the subject circuit block; and logically connecting the inside element with the outside element by:
(i) logically placing a pin within the subject block;
(ii) logically connecting the inside element to the pin; and
(iii) logically connecting the outside element to the pin.

16. The method of claim 2 wherein the circuit density center is determined according to capacitance, resistance, and relative location of the components.

* * * * *